(12) United States Patent
Yoshihara

(10) Patent No.: US 8,105,738 B2
(45) Date of Patent: Jan. 31, 2012

(54) DEVELOPING METHOD

(75) Inventor: Kousuke Yoshihara, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/096,095

(22) Filed: Apr. 28, 2011

(65) Prior Publication Data

US 2011/0269061 A1    Nov. 3, 2011

(30) Foreign Application Priority Data

Apr. 30, 2010   (JP) ................. 2010-104751

(51) Int. Cl.
*G03F 7/30* (2006.01)
*G03C 5/00* (2006.01)

(52) U.S. Cl. .......... 430/30; 430/312; 430/327; 430/331; 430/394; 430/434

(58) Field of Classification Search .............. 430/30, 430/312, 327, 331, 394, 434
See application file for complete search history.

(56) References Cited

FOREIGN PATENT DOCUMENTS

JP    7-147219 A    6/1995

*Primary Examiner* — Christopher Young
(74) *Attorney, Agent, or Firm* — Harry K. Ahn; Abelman Frayne & Schwab

(57) ABSTRACT

Disclosed is a developing method that performs a developing for forming a second resist pattern after forming and exposing a resist film on a surface of a substrate on which a first resist pattern is formed. The method includes a first process for developing the substrate for a first time period t1 in the state where the substrate stops, and a second process for developing the substrate for a second time period while rotating the substrate. The time ratio of first time period and second time period is adjusted so that a critical dimension of the first resist pattern is equal to a first predetermined value, and a total time of first time period and second time period is adjusted so that a critical dimension of the second resist pattern is equal to a second predetermined value.

20 Claims, 15 Drawing Sheets

FIG.15
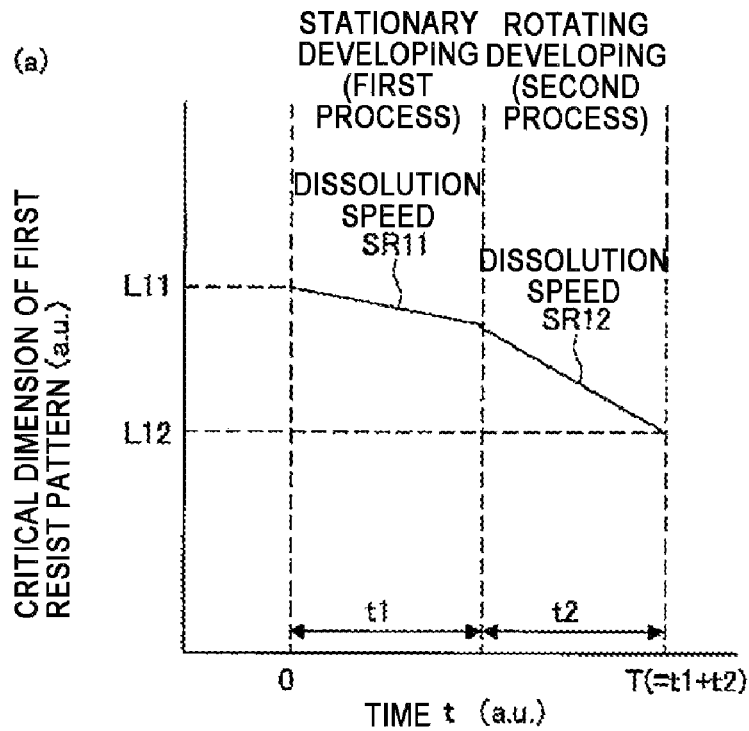
(a)
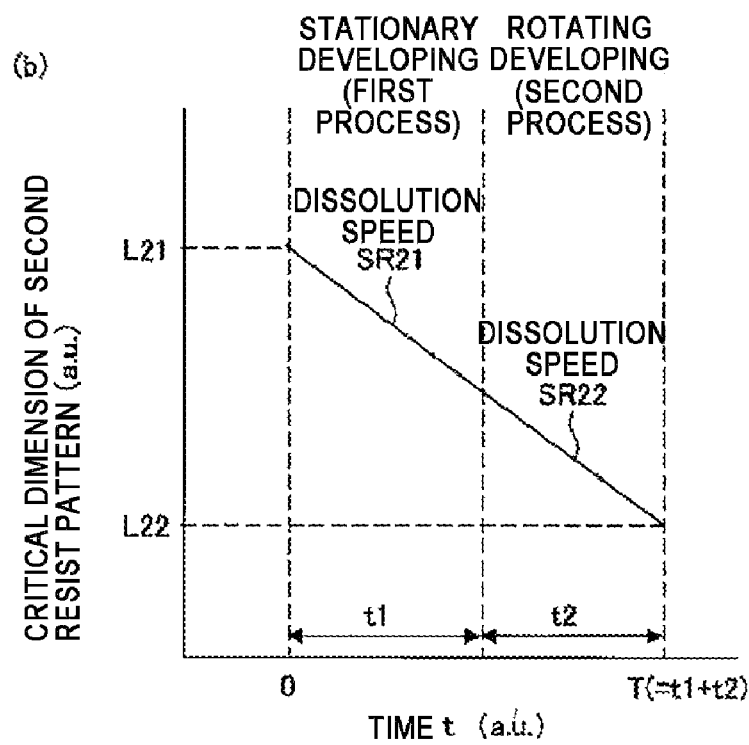
(b)

FIG.16
(a)
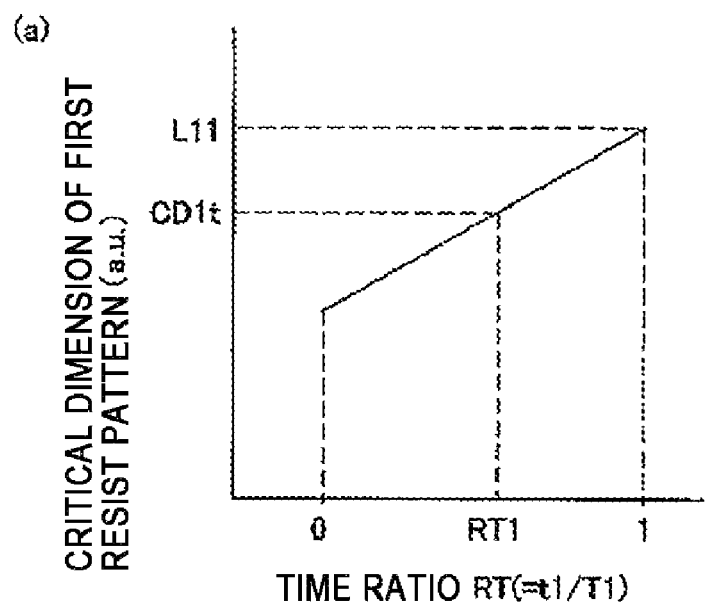
(b)
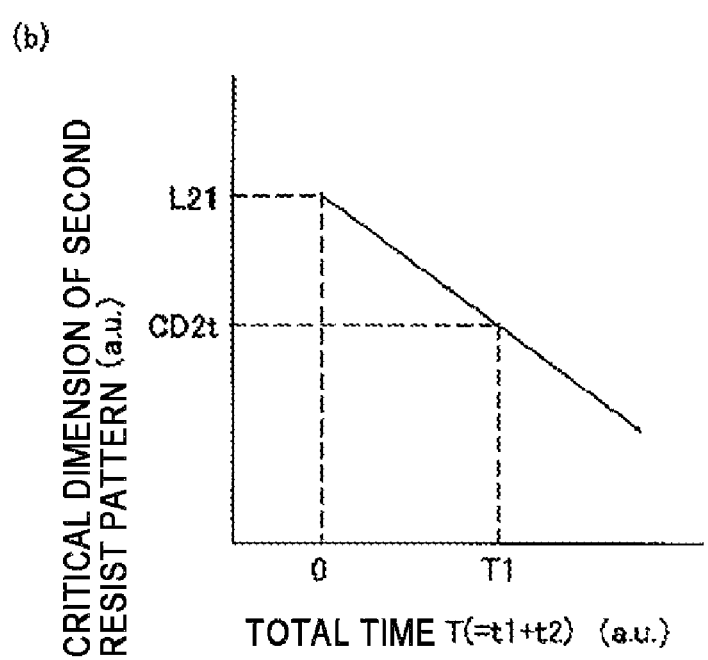

FIG.18
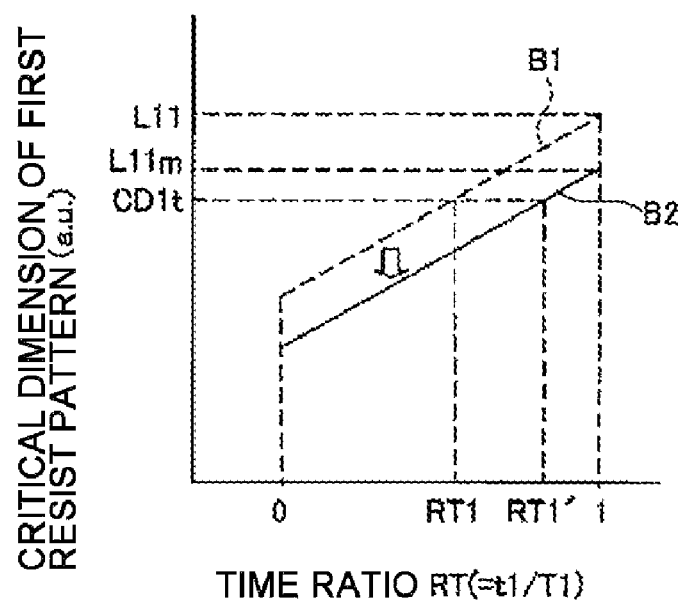
(a)
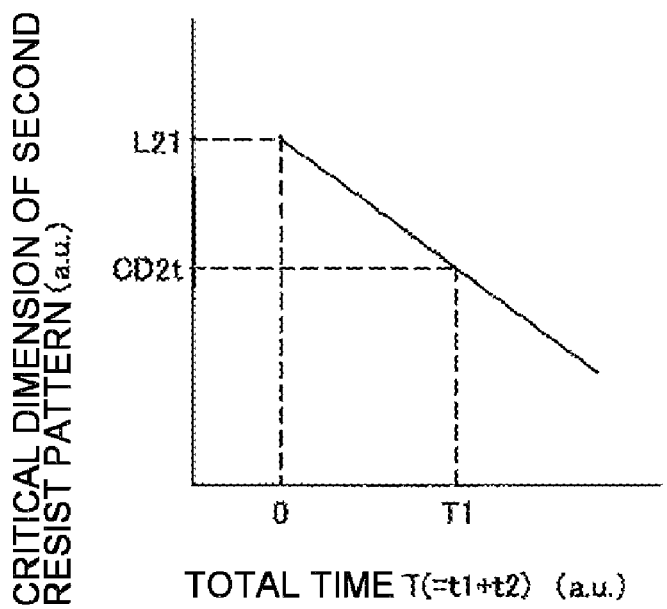
(b)

US 8,105,738 B2

DEVELOPING METHOD

CROSS-REFERENCE TO RELATED APPLICATIONS

This application is based on and claims priority from Japanese Patent Application No. 2010-104751, filed on Apr. 30, 2010, with the Japanese Patent Office, the disclosure of which is incorporated herein in its entirety by reference.

TECHNICAL FIELD

The present disclosure relates to a developing method for developing a substrate that is coated with a resist and exposed thereafter.

BACKGROUND

During the manufacturing of a semiconductor device, as a patterning technology for forming circuit patterns on a semiconductor wafer (hereinafter, simply referred to as a 'wafer') that is a substrate to be processed, photolithography has been used. Since the semiconductor device is becoming highly integrated in terms of improving the operating speed, the patterning technology using the photolithography has required the circuit patterns formed on the wafer to be fine. For this reason, although the wavelength of light used for exposure has been traditionally shortened, it cannot be sufficiently applied to an ultra-fine semiconductor device after 45 nm node.

As the patterning technology applicable for the ultra-fine semiconductor device after 45 nm node, a technology has been proposed performing a patterning process (e.g., formation of a resist film, exposure, heat treatment, developing) several times using the photolithography so as to form a pattern of a single layer. See, for example, Japanese Patent Application Laid-Open No. H07 (1995)-147219. In this case, a technology of performing the patterning process twice is referred to as a double patterning. As one technology of the double patterning, there is lithography-lithography-etching (LLE). The LLE performs a first patterning to form a first resist pattern, performs a second patterning to form a second resist pattern, and performs an etching process using a fine mask pattern formed of the first and second resist patterns.

SUMMARY

An exemplary embodiment of the present disclosure provides a developing method including forming a first resist pattern on a surface of a substrate, forming a resist film on the surface of the substrate in order to coat the first resist pattern, exposing the substrate formed with the resist film, and developing the substrate exposed at the exposing step to form a second resist pattern with the resist film while the first resist pattern remains. The method further includes a first process that supplies a developer to the surface of the substrate and develops the substrate for a first time period in a state where the substrate of which the surface is supplied with the developer stops, and a second process that develops the substrate by supplying the developer to the surface of the substrate for a second time period while rotating the substrate after the first process. In particular, a time ratio of the first time period to the second time period is adjusted so that a critical dimension of the remaining first resist pattern is equal to a first predetermined value and a total time of the first time period and the second time period is adjusted so that a critical dimension of the formed second resist pattern is equal to a second predetermined value.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 15 is a graph showing changes in critical dimension CD1 of first resist pattern P1 and critical dimension CD2 of second resist pattern P2 when stationary developing is performed for first time period t1, and rotating developing is performed for second time period t2.

FIG. 16 is a graph for describing a method of adjusting first time period t1 and second time period t2 so that critical dimension CD1 of first resist pattern P1 is equal to a first predetermined value CD1$t$, and critical dimension CD2 of second resist pattern P2 is equal to a second predetermined value CD2$t$.

FIG. 18 is a graph for describing a method of adjusting first time period t1 and second time period t2 so that critical dimension CD1 of first resist pattern P1 is equal to a first predetermined value CD1t, and critical dimension CD2 of second resist pattern P2 is equal to a second predetermined value CD2t.

DETAILED DESCRIPTION

Figure 1:
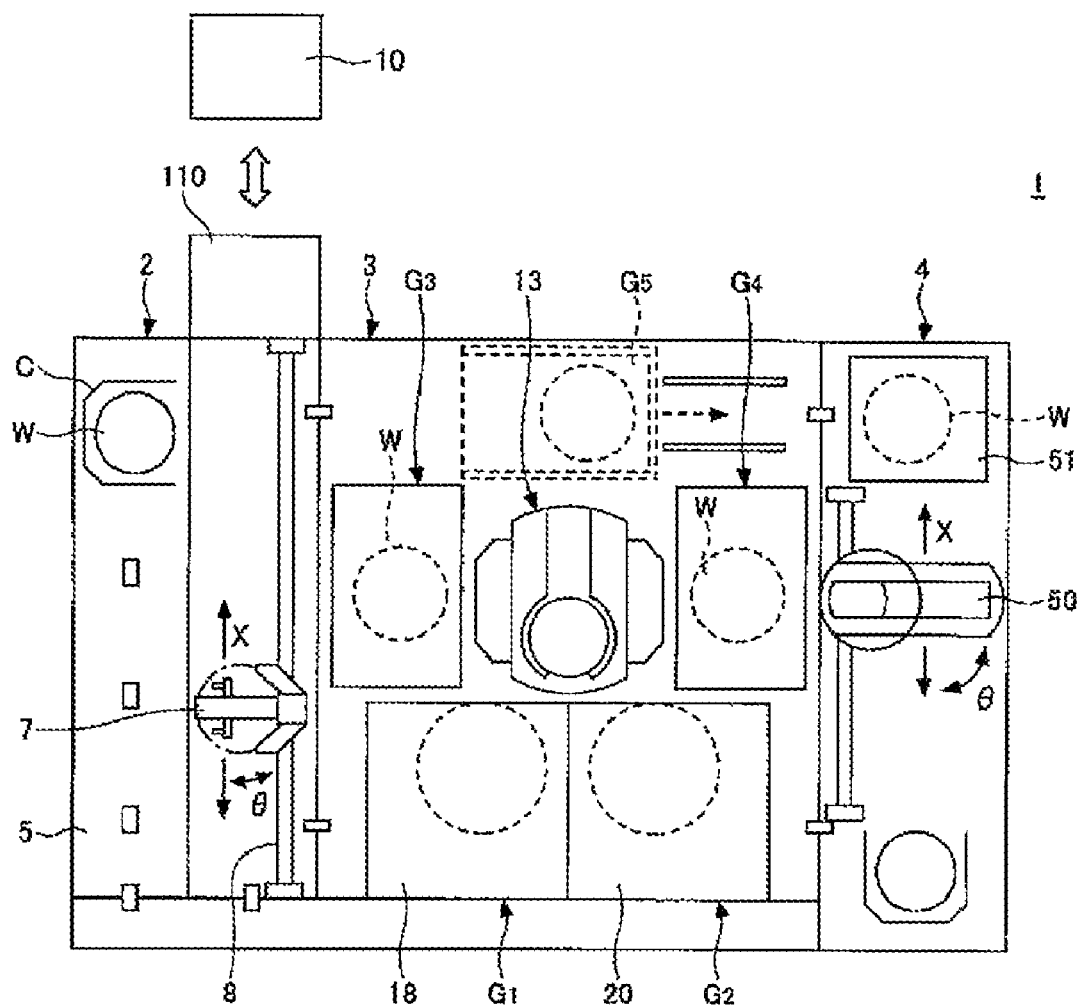
FIG. 1 is a plan view of a coating developing system according to an exemplary embodiment of the present disclosure.

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

When forming the resist pattern by performing the double patterning using the lithography-lithography-etching (LLE), the following problems occur.

Generally, in order to improve the dimension precision of a critical dimension CD of the resist pattern formed by the patterning, there is a need to adjust or correct processing conditions at the patterning.

Meanwhile, the double patterning using the LLE performs first patterning to form a first resist pattern and performs second patterning to form a second resist pattern. In order to precisely form a critical dimension CD2 of the second resist pattern, there is a need to adjust the processing conditions at the second patterning, in particular, the processing conditions of the developing (second developing) at the second patterning. In this case, a critical dimension CD1 of the remaining first resist pattern should not be changed at the second developing.

However, at the second developing, there is a case where the remaining first resist pattern may be also dissolved by reacting with a developer (e.g., a developing solution). For this reason, when adjusting the processing conditions of the second developing, critical dimension CD1 of the first resist pattern is also changed, such that both critical dimensions CD1 and CD2 of the first and second resist patterns cannot be precisely controlled. In order to precisely control both critical dimensions CD1 and CD2, the conditions of each process such as the first exposure, the first developing, the second exposure should be adjusted again starting from the second developing, such that it is not easy to control the critical dimensions.

The present disclosure has been made in an effort to provide a developing method capable of precisely controlling the critical dimension of a second resist pattern to be formed at second developing, and independently and precisely controlling the critical dimension of the remaining first resist pattern, when double patterning is performed using the LLE.

According to an embodiment, a developing method is provided including forming a first resist pattern on a surface of a substrate; forming a resist film on the surface of the substrate to coat the first resist pattern; exposing the substrate formed with the resist film; and developing the substrate exposed at the exposing step to form a second resist pattern with the resist film while the first resist pattern remains. The developing step further includes a first process that supplies a developer to the surface of the substrate and develops the substrate for a first time period in a state where the substrate of which the surface is supplied with the developer stops; and a second process that develops the substrate by supplying the developer to the surface of the substrate for a second time period while rotating the substrate, after the first process. In particular, a time ratio of the first time period to the second time period is adjusted so that a critical dimension of the remaining first resist pattern is equal to a first predetermined value, and a total time of the first time period and the second time period is adjusted so that a critical dimension of the formed second resist pattern is equal to a second predetermined value.

According to another embodiment, there is provided a developing method including forming a first resist pattern on a surface of a substrate; forming a resist film on the surface of the substrate to coat the first resist pattern; exposing the substrate formed with the resist film; and developing the substrate exposed at the exposing step to form a second resist pattern with the resist film while the first resist pattern remains. The developing step further includes a first process that develops the substrate by supplying a developer to the surface of the substrate for a first time period while rotating the substrate at a first revolutions; and a second process that develops the substrate by supplying the developer to the surface of the substrate for a second time period while rotating the substrate at a second revolution higher than the first revolutions, after the first process. In particular, a time ratio of the first time period to the second time period is adjusted so that a critical dimension of the remaining first resist pattern is equal to a first predetermined value, and a total time of the first time period and the second time period is adjusted so that a critical dimension of the formed second resist pattern is equal to a second predetermined value.

In the developing method described above, the second predetermined value may be equal to the first predetermined value. Also, the time ratio may be adjusted based on a first data showing a relationship between the time ratio and the critical dimension of the first resist pattern, and the total time may be adjusted based on a second data showing a relationship between the total time and the critical dimension of the second resist pattern.

The developing method described above may further include preparing the first data by performing the first process and the second process on each of the substrates of a first substrate group including a plurality of substrates by changing the time ratio for each substrate, and then, measuring the critical dimension of the first resist pattern remaining on each of the substrates; and preparing the second data by performing the first process and the second process on each of the substrates of a second substrate group including a plurality of substrates by changing the total time for each substrate, and then, measuring the critical dimension of the second resist pattern formed on each of the substrates.

The developing method described above may further include measuring the critical dimension of the formed first resist pattern prior to forming the resist film after forming the first resist pattern. In particular, the time ratio may be adjusted based on the measurement value of the measured critical dimension of the first resist pattern and the first data.

Hereinafter, exemplary embodiments of the present disclosure will be described with reference to the accompanying drawings.

Exemplary Embodiment

A developing method, a coating developing method including the developing method, and a coating developing system including a developing apparatus for performing the developing method according to an exemplary embodiment of the present disclosure will be described with reference to FIGS. 1 to 16.

Figure 2:
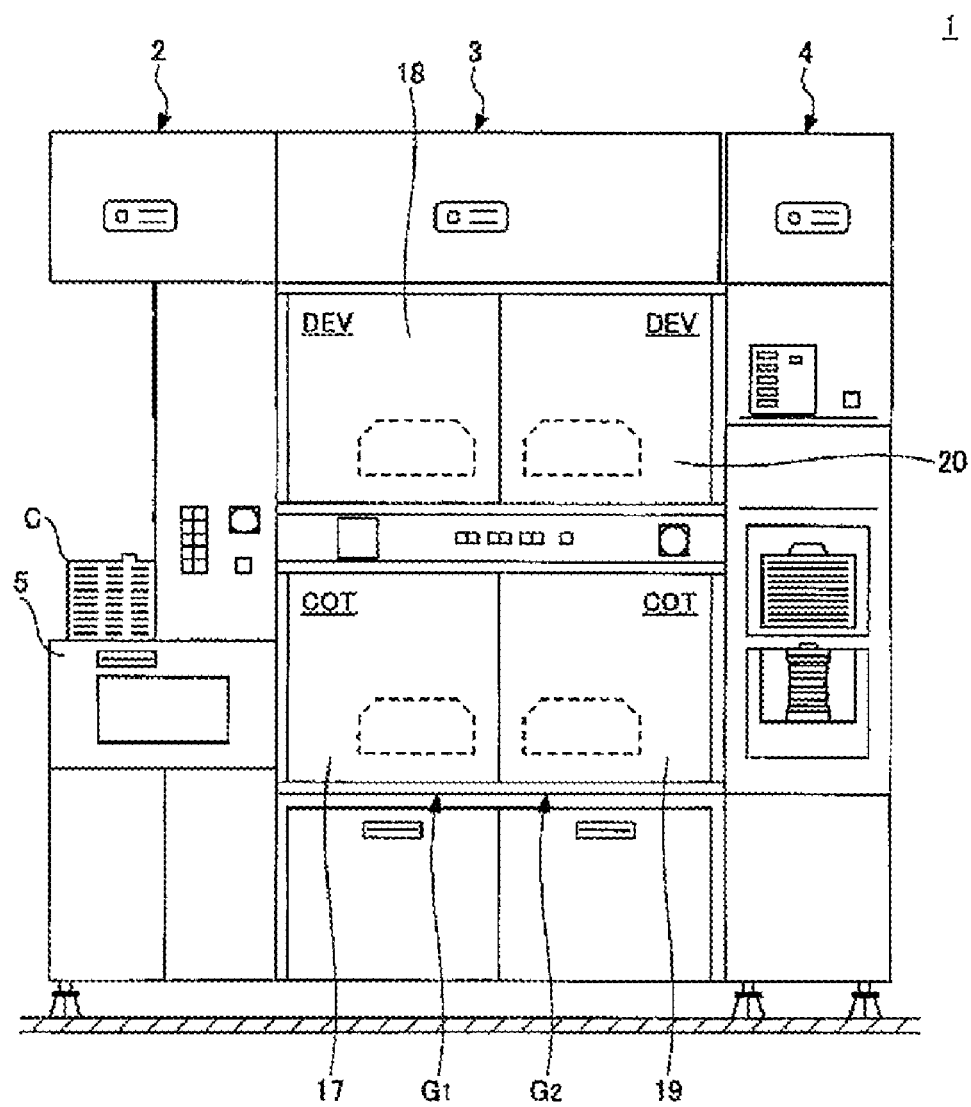
FIG. 2 is a front view of a coating developing system according to the exemplary embodiment of the present disclosure.
Figure 3:
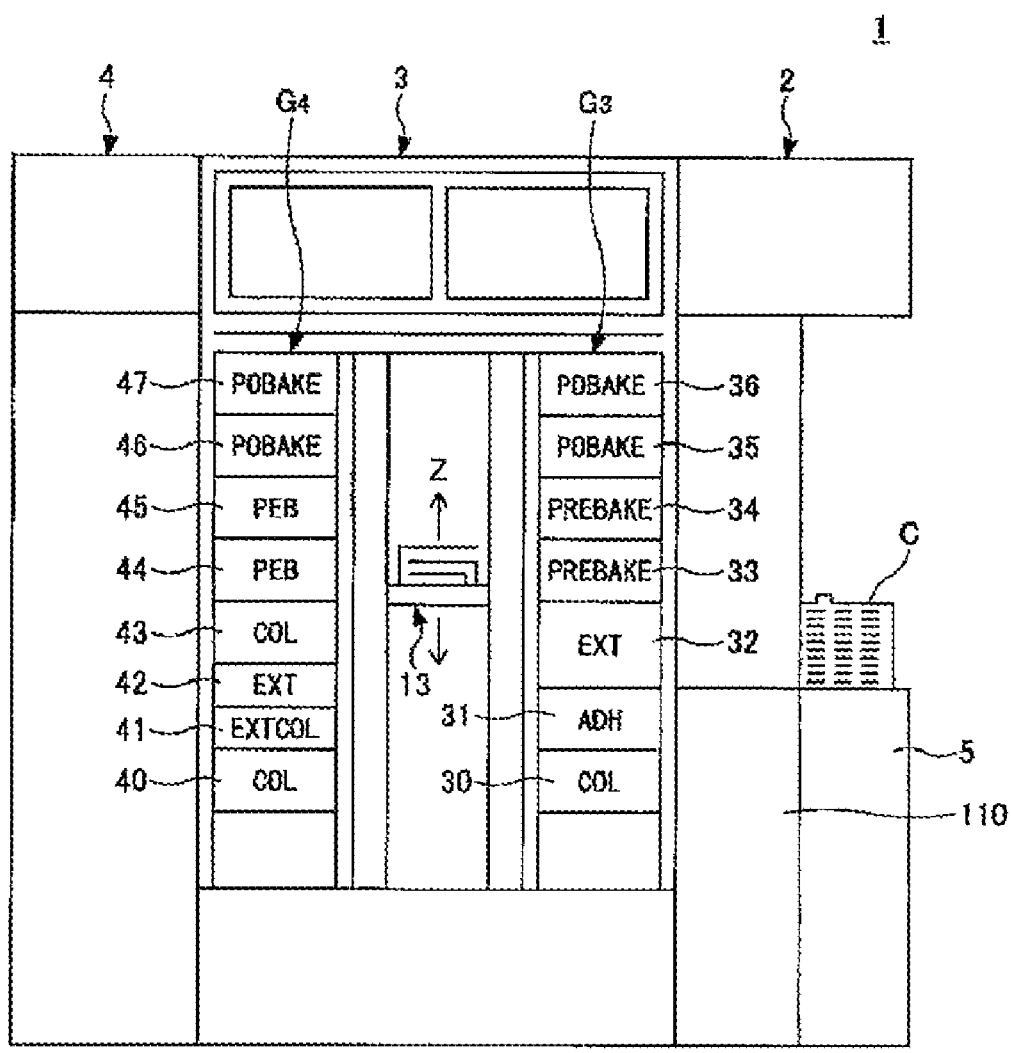
FIG. 3 is a rear view of a coating developing system according to the exemplary embodiment of the present disclosure.

First, a coating developing system 1 will be described with reference to FIGS. 1 to 3. FIG. 1 is a plan view of a coating developing system 1 according to the exemplary embodiment of the present disclosure, FIG. 2 is a front view of coating developing system 1, and FIG. 3 is a rear view of coating developing system 1.

As shown in FIG. 1, coating developing system 1 has a configuration where a cassette station 2, a processing station 3, and an interface part 4 are integrally connected. Cassette station 2 carries-in and carries-out, for example, 25 sheets of wafers W to coating developing system 1 in a cassette unit from the outside or carries-in and carries-out a wafer W to a cassette C. Processing station 3 is formed by disposing various processing apparatuses, which perform predetermined processes in a one by one manner, in multi-stage during the coating developing process. Interface part 4 is installed to be adjacent to processing station 3 and transfers the wafer W between coating developing system 1 and an exposure apparatus which is not shown.

Cassette station 2 is configured so that a plurality of cassettes C may be disposed at a predetermined position on a cassette loading table 5 in a row in an X direction (a vertical direction in FIG. 1). Further, a wafer transport system 7 that is transferable with respect to a cassette arrangement direction (X direction) and a wafer arrangement direction (Z direction: vertical direction) of wafer W received in cassette C and is rotatable in a θ direction (rotating direction based on a Z-axis), is movably installed along a transport path 8 and may selectively access each cassette C.

Wafer transport system 7 has an alignment function that positions wafer W. As described below, wafer transport system 7 is also configured to access an extension apparatus 32 belonging to a third processing apparatus group G3 at processing station 3 side.

Further, cassette station 2 is provided with a critical dimension measurement apparatus 110. Critical dimension measurement apparatus 110 is to measure a critical dimension CD of a resist pattern formed on wafer W.

The central portion of processing station 3 is provided with a main transport apparatus 13 and the circumference of main transport apparatus 13 is provided with various processing apparatuses in multi-stage to configure the processing apparatus group. In the exemplary embodiment of the present disclosure, four (4) processing apparatus groups G1, G2, G3, and G4 are disposed. The first and second processing apparatus groups G1 and G2 are disposed at a front side of coating developing system 1, the third processing apparatus group G3 is disposed to be adjacent to cassette station 2, and the fourth processing apparatus group G4 is disposed to be adjacent to interface part 4. Optionally, a fifth processing apparatus group G5 shown by a dotted line may be separately disposed at the rear side of coating developing system 1. Main transport apparatus 13 may carry-in and carry-out wafer W to various processing apparatuses to be described below that are disposed in these processing apparatus groups G1, G2, G3, and G4. The number or arrangement of processing apparatus groups may be changed according to the kind of processing that is performed on wafer W. If the number of processing apparatus groups is one or more, it may not be limited to four.

For example, as shown in FIG. 2, in first processing apparatus group G1, a resist coating apparatus 17 coating a liquid resist on wafer W and a developing apparatus 18 performing the developing method according to the exemplary embodiment of the present disclosure are disposed in two stages in order from below. Similarly, even in the case of the second processing apparatus group G2, a resist coating apparatus 19 and a developing apparatus 20 overlap in two stages in order from below.

For example, as shown in FIG. 3, in third processing apparatus group G3, a cooling apparatus (COL) 30, an adhesion apparatus (ADH) 31, an extension apparatus (EXT) 32, pre baking apparatuses (PREBAKE) 33 and 34, post baking apparatuses (POBAKE) 35 and 36, etc., overlap in, for example, seven (7) stages in order from below. Cooling apparatus 30 is to cool wafer W. Adhesion apparatus 31 is to increase an adhesion between the liquid resist and wafer W. Extension apparatus 32 is to wait for wafer W. Pre baking apparatuses 33 and 34 are to dry a solvent in the liquid resist. Post baking apparatuses 35 and 36 are to perform heating after the developing.

In the fourth processing apparatus group G4, a cooling apparatus (COL) 40, an extension cooling apparatus (EXT-COL) 41, an extension apparatus (EXT) 42, a cooling apparatus (COL) 43, post exposure baking apparatuses (PEB) 44 and 45, post baking apparatuses (POBAKE) 46 and 47, etc., overlap in, for example, eight (8) stages in order from below. Extension cooling apparatus 41 is to wait for wafer W while cooling disposed wafer W. Post exposure baking apparatuses 44 and 45 are to perform heating after the exposure processing.

The central portion of interface part 4 is provided with a wafer transport system 50. Wafer transport system 50 is configured so that the movement of the X direction (a vertical direction in FIG. 1) and the Z direction (a vertical direction) and the rotation of the Θ direction (a rotation direction based on the Z-axis) may be made. Wafer transport system 50 is configured so that it may access extension cooling apparatus 41, extension apparatus 42 belonging to the fourth processing apparatus group G4, a peripheral exposure apparatus 51, and an exposure apparatus (not shown), and carry wafer W into each of the above apparatuses.

Figure 4:
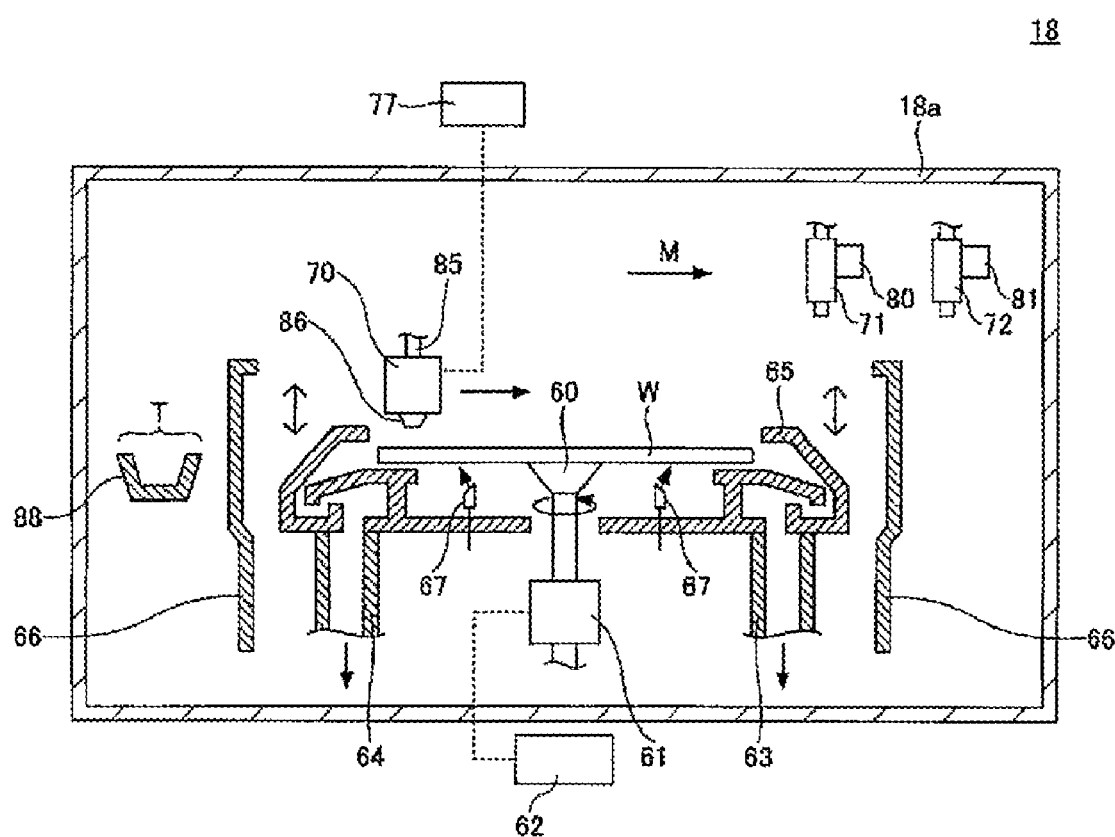
FIG. 4 is a cross-sectional view showing an overall configuration of a developing apparatus.
Figure 5:
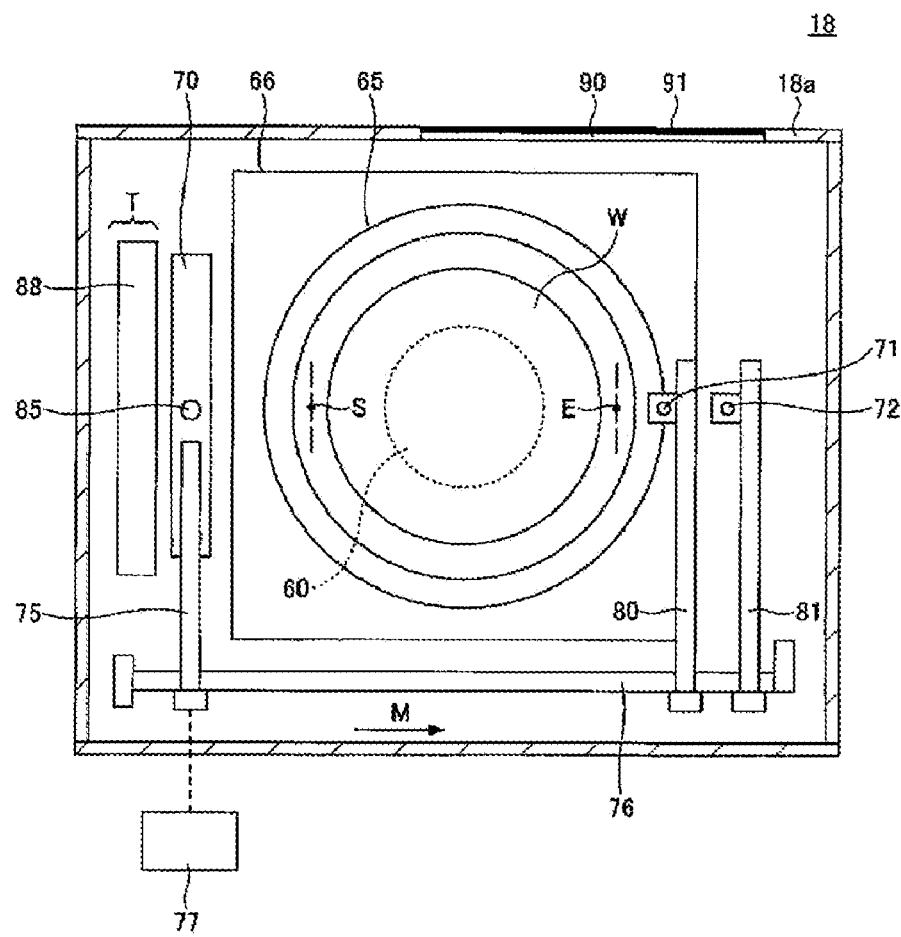
FIG. 5 is a plan view showing the developing apparatus.
Figure 6:
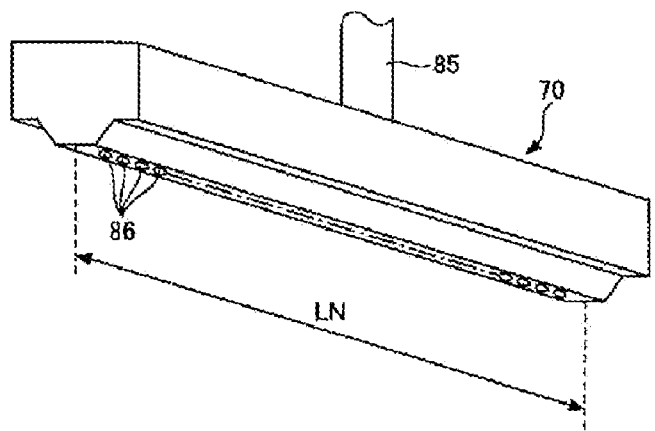
FIG. 6 is a perspective view showing a developer supplying nozzle used for the developing apparatus.
Figure 7:
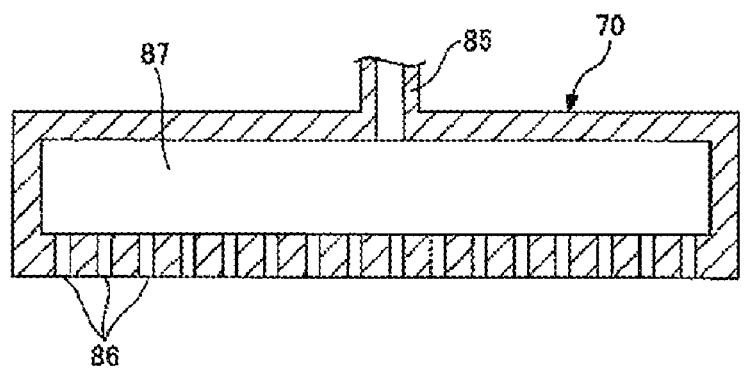
FIG. 7 is a cross-sectional view showing the developer supplying nozzle used for the developing apparatus.

Next, developing apparatus 18 will be described with reference to FIGS. 4 to 7. FIG. 4 is a cross-sectional view showing an overall configuration of developing apparatus 18. FIG. 5 is a plan view showing developing apparatus 18. FIG. 6 is a perspective view showing a first developer supplying nozzle 70 used for developing apparatus 18. FIG. 7 is a cross-sectional view showing first developer supplying nozzle 70 used for developing apparatus 18.

As shown in FIGS. 4 and 5, a spin chuck 60 that is a suction retaining part sucking and retaining wafer W is mounted in a casing 18a of developing apparatus 18. A rotating driving mechanism 61 including, for example, a motor, etc., which rotates spin chuck 60, is mounted under spin chuck 60. The driving of rotating driving mechanism 61 is rotatably controlled by a rotating control apparatus 62, and is configured to rotate or stop wafer W according to predetermined rotating time, revolutions, and rotating acceleration. Further, rotating driving mechanism 61 of spin chuck 60 has a function of vertically moving spin chuck 60 to vertically move spin chuck 60 at the time of carrying-in and carrying-out wafer W, thereby making it possible to transfer wafer W to/from main transport apparatus 13.

The outside of the outer circumference of spin chuck 60 is provided with an annular cup 65 of which the top surface is opened while surrounding the outer circumference of spin chuck 60. Annular cup 65 is configured to receive a developer scattered from the rotated wafer W, which is sucked and retained on spin chuck 60, thereby preventing the peripheral apparatuses from being polluted. The bottom portion of cup 65 is provided with a drain tube 63 that discharges the developer, etc., scattered from wafer W, etc., and an exhaust tube 64 that exhausts the inside of cup 65. Further, cup 65 is provided with a rear cleaning nozzle 67 that cleans the rear of wafer W by supplying a cleaning liquid to the rear of wafer W maintained on spin chuck 60. Cup 65 is provided with a driving mechanism (not shown) to vertically move entire cup 65, thereby making it possible to retreat cup 65 downwardly so as not to hinder the movement of first developer supplying nozzle 70 to be described below.

The outside of cup 65 is provided with a rectangular out cup 66 of which the top surface is opened while surrounding cup 65, such that out cup 66 receives the developer, etc., from wafer W and first developer supplying nozzle 70 to be described below that cannot be received completely in cup 65. Out cup 66 is provided with a driving mechanism (not shown) that can vertically move out cup 66 and rises, for example, when wafer W is cleaned, thereby making it possible to more completely collect the scattered cleaning liquid, etc.

As shown in FIG. 5, in casing 18a, a first developer supplying nozzle 70, a second developer supplying nozzle 71, and a cleaning nozzle 72 are disposed at both sides of out cup 66. First developer supplying nozzle 70 is to mainly supply the developer to wafer W at the time of the stationary developing. Second developer supplying nozzle 71 is to mainly supply the developer to wafer W at the time of the rotating developing. Cleaning nozzle 72 is to supply the cleaning liquid to the top surface of wafer W.

As shown in FIG. 5, first developer supplying nozzle 70 is maintained while being suspended by an arm 75. Arm 75 is configured to be able to move on a rail 75 extending in one direction (arrow M direction in FIG. 5) in casing 18a, and the movement speed or the moving timing of arm 75 is controlled by a movement control apparatus 77. By this configuration, first developer supplying nozzle 70 may move on wafer W in parallel along the M direction. Further, arm 75 is configured to have a motor, etc., such that arm 75 vertically moves, thereby making it possible to optimally control a distance between a front end of a discharge hole of first developer supplying nozzle 70 and wafer W at the time of the supply of the developer.

As shown in FIGS. 5 and 6, first developer supplying nozzle 70 has an elongated shape and a length LN thereof is at least longer than a diameter of wafer W. The top of first developer supplying nozzle 70 is connected with one end of a pipe 85 that introduces the developer into first developer supplying nozzle 70 from a developer supplying source (not shown). The bottom portion of first developer supplying nozzle 70 is provided with a plurality of developer supplying holes 86 in a row in a longitudinal direction. Further, as shown in FIG. 7, the inside of first developer supplying nozzle 70 is provided with a long liquid storage part 87 in a longitudinal direction communicating with each of developer supplying holes 86. Long liquid storage part 87 is configured to store the developer introduced into first developer supplying nozzle 70 from pipe 85 once and simultaneously discharge the developer at the same flux and the same pressure through each of developer supplying holes 86 from liquid storage part 87.

In addition, as shown in FIGS. 4 and 5, a waiting position T of first developer supplying nozzle 70 positioned at the outside of out cup 66 is provided with a waiting cleaning part 88 that cleans first developer supplying nozzle 70. Waiting cleaning part 88 has a concave-shaped cross section to receive elongated first developer supplying nozzle 70 and the inside of waiting cleaning part 88 is provided with a mechanism for cleaning the developer attached to first developer supplying nozzle 70.

In addition, second developer supplying nozzle 71 for supplying the developer to the center of wafer W is supported by arm 80, wherein arm 80 is configured to move on rail 76 by the driving mechanism (not shown). Therefore, second developer supplying nozzle 71 may move in the M direction, similar to first developer supplying nozzle 70. Further, when arm 80 is positioned above the center of wafer W, second developer supplying nozzle 71 is mounted to be able to supply the developer to, for example, the center of wafer W. By this configuration, the developer supplied onto the rotating wafer W is diffused to the entire surface of wafer W, thereby developing the entire surface of wafer W without a stain. Alternatively, it may be allowed to supply the developer onto wafer W while moving second developer supplying nozzle 71 to a position corresponding to the circumferential edge of wafer W from the central portion of wafer W.

It may be allowed to supply the developer from first developer supplying nozzle 70 by rotating wafer W at the time of the rotating developing without mounting second developer supplying nozzle 71.

Meanwhile, cleaning nozzle 72 that discharges the cleaning liquid, for example, deionized water is supported by a rinse arm 81, and rinse arm 81 is configured to be able to move on rail 76 by a driving mechanism (not shown). Therefore, cleaning nozzle 72 may move in the M direction, similar to first developer supplying nozzle 70 or second developer supplying nozzle 71. Further, when rinse arm 81 is positioned above the center of wafer W, cleaning nozzle 72 is mounted to be able to supply the developer to, for example, the center of wafer W. By this configuration, the cleaning liquid supplied onto the rotating wafer W is diffused to the entire surface of wafer W, thereby cleaning the entire surface of wafer W without a stain. It may be allowed to supply the cleaning liquid onto wafer W while moving cleaning nozzle 72 to a position corresponding to the circumferential edge of wafer W from the central portion of wafer W.

Further, casing 18a is provided with a transport hole 90 for carrying-in and carrying-out wafer W by main transport apparatus 13 and a shutter 91 opening and closing transport hole 90. Further, except for the case of carrying-in and carrying-out wafer W, shutter 91 is closed to maintain predetermined atmosphere while preventing a processing liquid from being scattered from the inside of casing 18a, etc.

Figure 8:
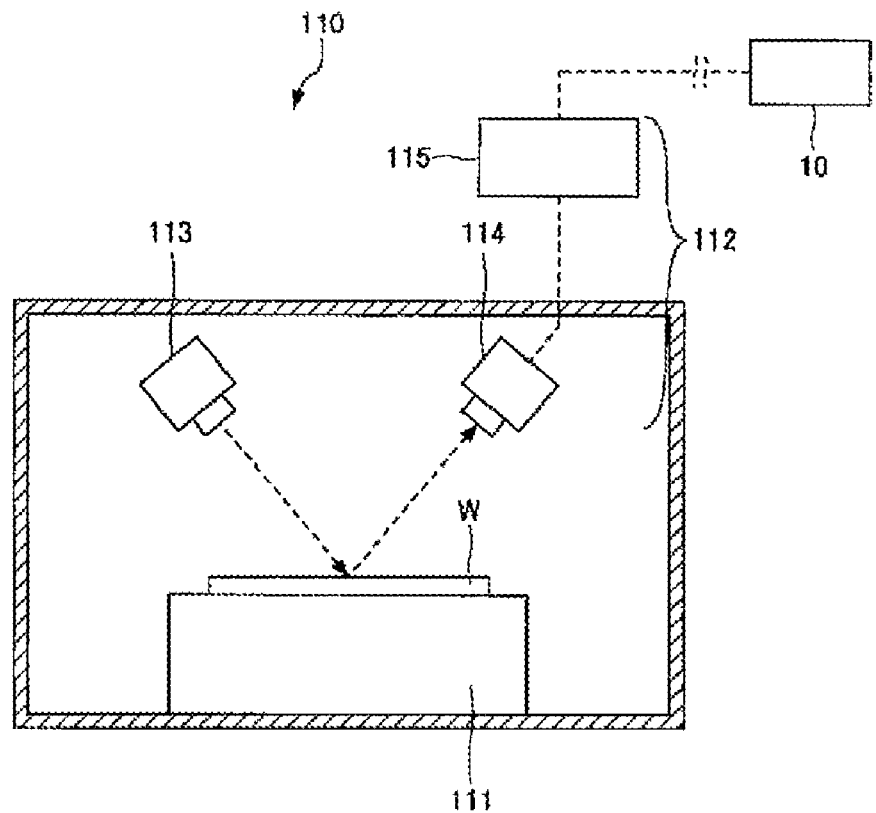
FIG. 8 is a longitudinal cross-sectional view schematically showing the configuration of a critical dimension measurement apparatus.

Next, critical dimension measurement apparatus 110 will be described with reference to FIG. 8. FIG. 8 is a longitudinal cross-sectional view schematically showing a configuration of critical dimension measurement apparatus 110.

For example, as shown in FIG. 8, critical dimension measurement apparatus 110 includes a loading table 111 on which wafer W is horizontally disposed and an optical surface shape measurement system 112. Loading table 111 is formed of, for example, an X-Y stage and may thus move in a two-dimensional direction of a horizontal direction. Optical surface shape measurement system 112 includes, for example, a light irradiating unit 113, a photodetector 114, and a calculator 115. Light irradiating unit 113 irradiates light at an inclined direction with respect to wafer W. Photodetector 114 detects the light irradiated from light irradiating unit 113 and reflected from wafer W. Calculator 115 calculates a critical dimension CD of the resist pattern on wafer W based on the light receiving information of photodetector 114. Critical dimension measurement apparatus 110 measures critical dimension CD of the resist pattern using, for example, a scatterometry method. In the case of using the scatterometry method, calculator 115 compares light intensity distribution, detected by photodetector 114, in the surface of wafer W with pre-stored virtual light intensity distribution. Further, critical dimension CD of the resist pattern may be measured by obtaining critical dimension CD of the resist pattern corresponding to the compared virtual light intensity distribution.

In addition, critical dimension measurement apparatus 110 relatively and horizontally moves wafer W with respect to light irradiating unit 113 and photodetector 114, thereby making it possible to measure critical dimension CD at a plurality of measurement points in the surface of wafer W.

The coating developing performed in coating developing system 1 configured as described above is controlled by a body controller 10 shown in FIG. 1. Body controller 10 also controls the critical dimension measurement of the resist pattern on wafer W by critical dimension measurement apparatus 110. Body controller 10 is configured by a general-purpose computer having a CPU or a memory, etc., thereby making it possible to control the wafer processing or the critical dimension measurement by executing a pre-stored program. The program of body controller 10 may be installed on body controller 10 by a computer-readable recording medium.

Figure 9:
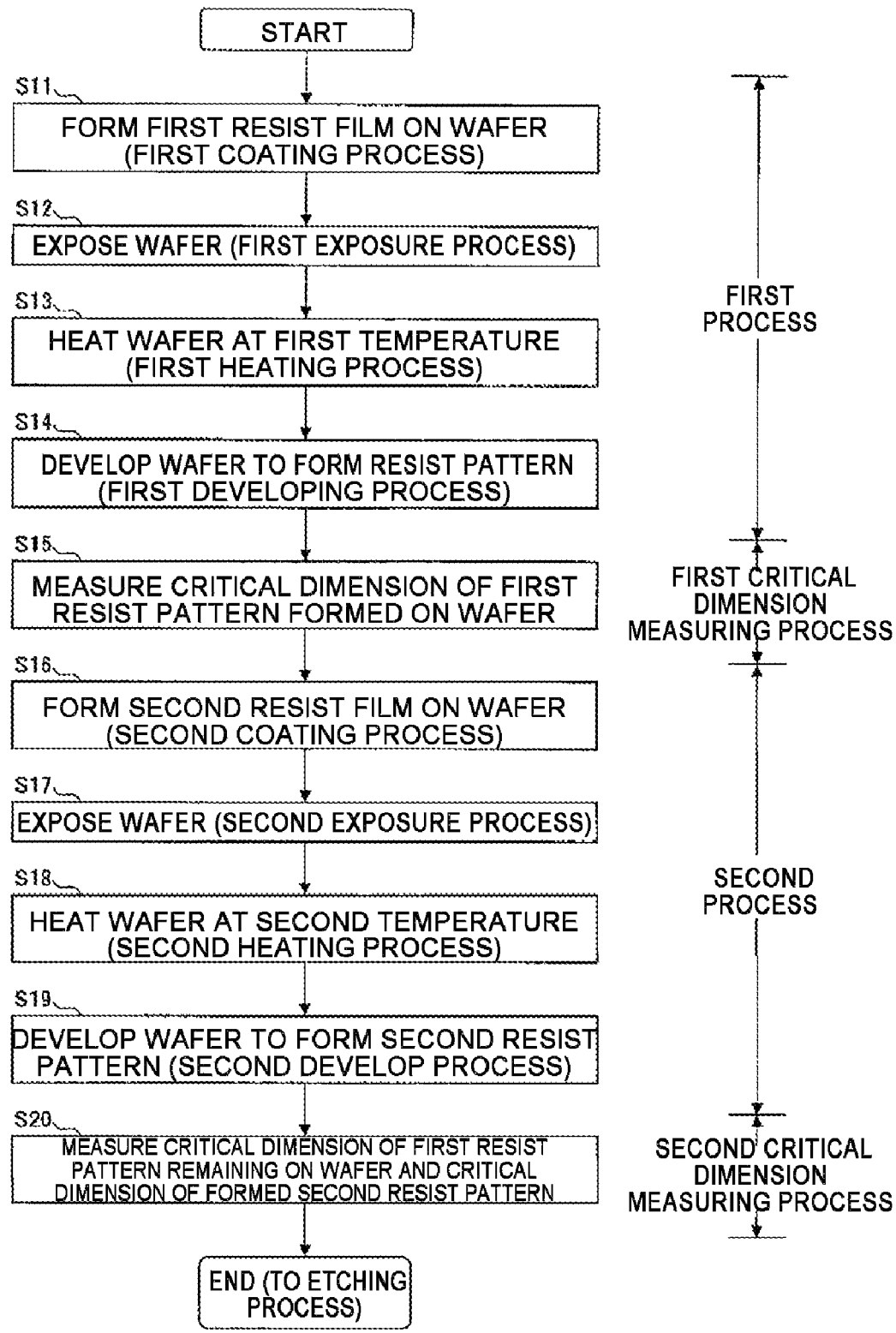
FIG. 9 is a flow chart for describing an order of each process of a coating developing method including a developing method according to the exemplary embodiment of the present disclosure.
Figure 10:
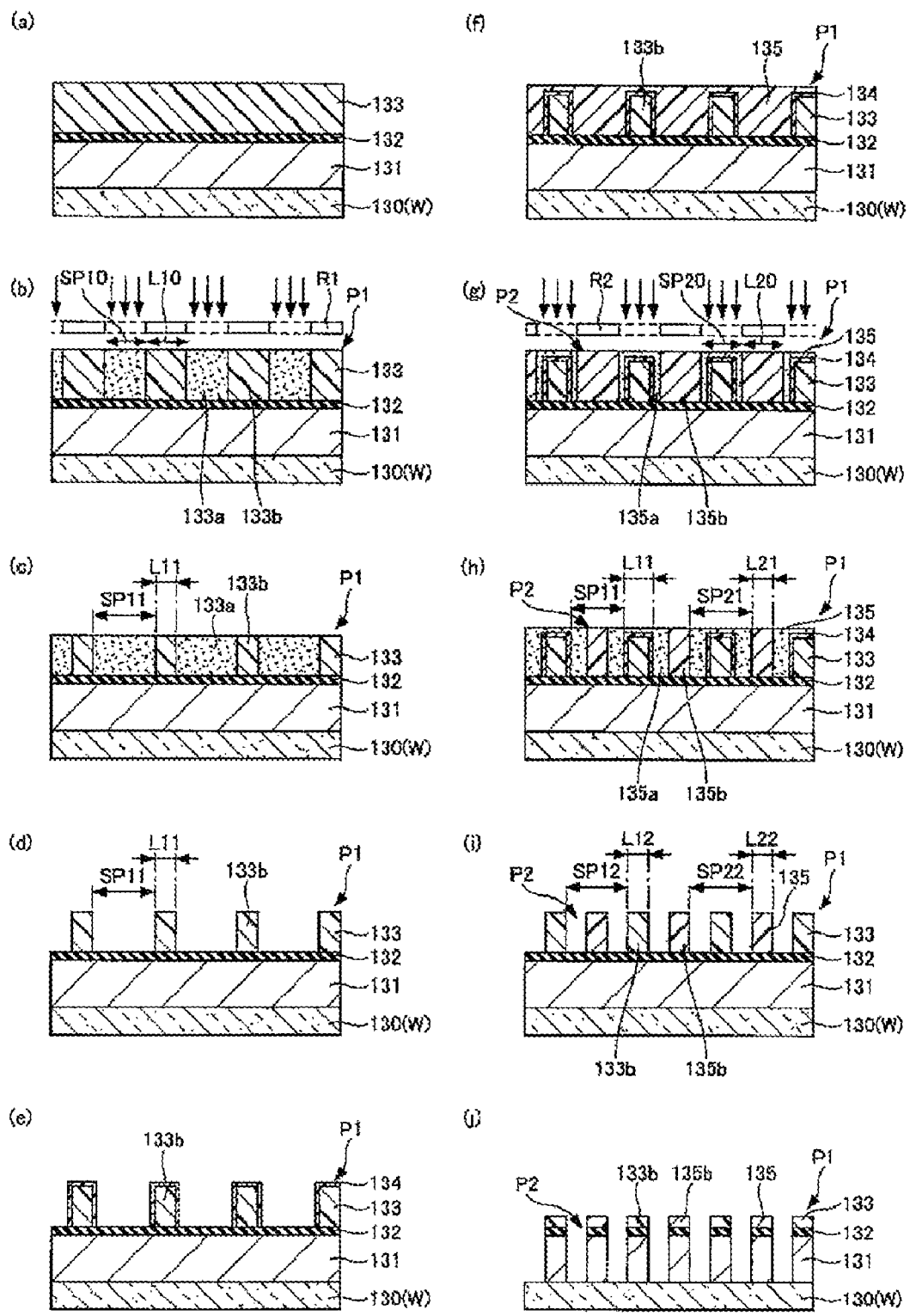
FIG. 10 is a cross-sectional view showing a state of a wafer at each process of the coating developing method including the developing method according to the exemplary embodiment of the present disclosure.

Next, the coating developing method including the developing method according to the exemplary embodiment of the present disclosure will be described with reference to FIGS. 9 and 10. FIG. 9 is a flow chart for describing an order of each process of the coating developing method. FIG. 10 is a cross-sectional view showing the state of wafer W at each process of the coating developing method.

As shown in FIG. 9, the coating developing method including the developing method according to the exemplary embodiment of the present disclosure includes a first process (S11 to S14), a first critical dimension measurement process (S15), a second process (S16 to S19), and a second critical dimension measurement process (S20). The first process (S11 to S14) include a first coating process (S11), a first exposure process (S12), a first heating process (S13), and a first developing process (S14). The second process (S16 to S19) includes a second coating process (S16), a second exposure process (S17), a second heating process (S18), and a second developing process (S19).

At the beginning, the first process (S11 to S14) is performed. First, the first coating process (S11) is performed. During the first coating process (S11), a first resist film 133 is formed by coating the resist liquid to a wafer 130 (wafer W). FIG. 10A shows the state of wafer 130 (wafer W) during the first coating process (S11).

Prior to performing the first coating process (S11), a lower anti-reflection coating 132 is previously formed on wafer 130 (wafer W) of which the surface is formed with an etched film 131.

A sheet of non-processed wafer W is taken out from cassette C by wafer transport system 7 and is carried in adhesion apparatus 31 belonging to third processing apparatus group G3. Adhesion apparatus 31 coats an adhesion reinforcing agent such as hexamethyldisilazane (HMDS) in order to improve the adhesion with the liquid resist. Thereafter, wafer W is transported to cooling apparatus 30 by main transport apparatus 13 and is cooled at a predetermined temperature. Further, wafer W cooled at the predetermined temperature is transported to resist coating apparatus 17 or 19 and the resist liquid is coated on wafer 130 (wafer W), thereby forming first resist film 133.

An example of the resist used to form first resist film 133 is a chemical-amplified resist. As a detailed example, the exemplary embodiment of the present disclosure may use a chemical-amplified positive resist that may cope with exposure using an ArF excimer laser (wavelength 193 nm) as a light source.

Further, wafer 130 (wafer W) on which first resist film 133 is formed is transported to, for example, pre baking apparatus 33 or 34 by main transport apparatus 13 and is subjected to the heating (pre bake). Thereafter, wafer 130 (wafer W) is transported to extension cooling apparatus 41 by main transport apparatus 13 and is cooled at a predetermined temperature.

Next, the first exposure process (S12) is performed. During the first exposure process (S12), wafer 130 (wafer W) on which first resist film 133 is formed is exposed.

FIG. 10B shows the state of wafer 130 (wafer W) during the first exposure process (S12).

Wafer W is taken out from extension cooling apparatus 41 by wafer transport system 50 and is then transported to the exposure apparatus (not shown) through peripheral exposure apparatus 51. Further, the first exposure is performed on wafer W transported to the exposure apparatus.

When the first exposure is performed, as shown in FIG. 10B, the selected portion of first resist film 133 is exposed by using a first reticle R1 to generate a soluble part 133a that is selectively dissolved by the developer made of, for example, an alkaline solvent, etc. By selectively generating soluble part 133a, a first pattern P1 is obtained in first resist film 133 including soluble part 133a that is dissolved by the developer and an insoluble part 133b that is not dissolved by the developer.

Herein, for example, first pattern P1 is obtained by using first reticle R1 having patterns where lines are arranged. As shown in FIG. 10B, a critical dimension L10 and a space width SP10 of first pattern P1 may be, for example, 32 nm and 32 nm, respectively.

In addition, wafer W that is subjected to the first exposure is transported to extension apparatus 42 by wafer transport system 50 and is then maintained in main transport apparatus 13.

Next, the first heating process (S13) is performed. During the first heating process (S13), wafer W is heated. FIG. 10C shows the state of wafer 130 (wafer W) during the first heating process (S13).

Wafer W maintained in main transport apparatus 13 is transported to post exposure baking apparatus 44 or 45. Further, wafer W transported to post exposure baking apparatus 44 or 45 is subjected to the heating (post exposure baking). Wafer W that is subjected to the heating is transported to cooling apparatus 43 by main transport apparatus 13 and is then subjected to the cooling.

The change into soluble part 133a of insoluble part 133b is promoted by performing the first heating process (S13). Therefore, as shown in FIG. 10C, the critical dimension L10 of first pattern P1 is slightly reduced to be L11 and the space width SP10 of first pattern P1 is slightly increased to be SP11.

Next, the first developing process (S14) is performed. During the first developing process (S14), first resist pattern P1 is formed by developing wafer W that is subjected to the first heating process (S13). FIG. 10D shows the state of wafer 130 (wafer W) during the first developing process (S14).

Wafer W that is subjected to the first heating process (S13) is taken out from cooling apparatus 43 by main transport apparatus 13 and is transported to developing apparatus 18 or 20. For example, wafer W transported into developing apparatus 18 is absorbed and retained onto spin chuck 60. Further, first developer supplying nozzle 70 waiting within waiting cleaning part 88 present at the waiting position T moves to a start position S (shown in FIG. 5) that is within cup 65 and is the outside of an end of wafer W. In addition, the developer starts to discharge at the start position S, which is experimentally discharged until the discharge state is stabilized.

First, first developer supplying nozzle 70 performs the developer supplying process while moving from the start position S of the outside of an end of wafer W to an end position E of the outside of the other end at a speed of 30 to 100 mm/sec, while discharging the developer. In this case, the developer is supplied to the entire surface of wafer W to form a liquid film of the developer of a predetermined thickness, for example, about 1 mm. Further, the developing of first resist film 133 of wafer 130 (wafer W) starts at the same time of supplying the developer onto wafer W by first developer supplying nozzle 70.

During first developing process (S14), soluble part 133a of first resist film 133 is dissolved and removed by using an alkaline solvent, such as, for example, tetramethyl ammonium hydroxide (TMAH), etc., such that only insoluble part 133b remains to form first resist pattern P1 as shown in FIG. 10D.

When first resist pattern P1 is formed and the developing ends, cleaning nozzle 72 moves above the central portion of wafer W and the rotation of wafer W starts at a predetermined speed and the cleaning liquid is supplied to wafer W from cleaning nozzle 72 and rear cleaning nozzle 67 to clean wafer W. In this case, cup 65 and out cup 66 rise, such that they receive the cleaning liquid, etc., scattered from wafer W.

When the supply of the cleaning liquid stops, wafer W is rotated at a more rapid speed to dry wafer W. Further, when the drying process of wafer W ends, the first developing of wafer W ends, such that wafer W is carried out from developing apparatus 18 by main transport apparatus 13. Wafer W carried-out by main transport apparatus 13 is transported to post baking apparatus 35 or 36 and is subjected to the heating (post bake). Thereafter, wafer W is transported to extension apparatus 32, and is then received in cassette C by wafer transport system 7.

Next, the first critical dimension measurement process (S15) is performed. During the first critical dimension measurement process (S15), critical dimension CD1 of first resist pattern P1 formed on wafer 130 (wafer W) is measured.

Wafer W received in cassette C is transported to critical dimension measurement apparatus 110 by wafer transport system 7. Further, the critical dimension CD1 (or L11) of first resist pattern P1 shown in FIG. 10D are measured by critical dimension measurement apparatus 110.

In the exemplary embodiment of the present disclosure, critical dimension CD1 implies the critical dimension L11 for convenience. However, even though critical dimension CD1 implies space width SP11, positive and negative signs of dissolution speed SR11 and SR12 to be described below are only reverse and the exemplary embodiment of the present disclosure may be applied at all times.

In addition, during the first critical dimension measurement process (S15), it may be allowed to perform the measurement at a representative point such as a central point within the surface of wafer W and it may be allowed to perform the measurement at a plurality of measurement points within the surface of wafer W.

Next, the second process (S16 to S19) is performed. First, the second coating process (S16) is performed. During the second coating process (S16), a second resist film 135 is formed by coating the liquid resist to wafer W. FIGS. 10E and 10F show the state of wafer 130 (wafer W) during the second coating process (S16). Second resist film 135 corresponds to the resist film of the exemplary embodiment of the present disclosure.

However, prior to the second coating process (S16), wafer 130 (wafer W) may be subjected to curing by the surface processing of first resist pattern P1 prepared during the first process (S11 to S14), for example, ultraviolet irradiation. Therefore, when the second coating process (S16) is performed, it may prevent the dissolution or deterioration of first resist pattern P1. For example, a curing unit is mounted in coating developing system 1 and wafer W is transported to the curing unit to cure wafer W. As a result, as shown in FIG. 10E, a surface 134 of first resist pattern P1 is subjected to the curing.

As a result, wafer 130 (wafer W) where surface 134 of first resist pattern P1 is subjected to the curing is subjected to the second coating process (S16). Even during the second coating process (S16), similar to the first coating process (S11), a sheet of wafer W formed with first resist pattern P1 from cassette C by wafer transport system 7 is taken out, is carried in adhesion apparatus 31, and is coated with the adhesion reinforcing agent. Thereafter, wafer W is transported to cooling apparatus 30 by main transport apparatus 13, is cooled at the predetermined temperature, and is transported to resist coating apparatus 17 or 19 to coat wafer 130 (wafer W) with the liquid resist, such that second resist film 135 is formed as shown in FIG. 10F.

An example of the resist used to form second resist film 135 is also the chemical-amplified resist and may use the chemical-amplified positive resist that may cope with exposure using an ArF excimer laser (wavelength 193 nm) as a light source.

Further, wafer 130 (wafer W) on which second resist film 135 is formed is transported to, for example, pre baking apparatus 33 or 34 by main transport apparatus 13 and is subjected to the heating (pre bake). Thereafter, wafer 130 (wafer W) is transported to extension cooling apparatus 41 by main transport apparatus 13 and is cooled at a predetermined temperature.

Next, the second exposure process (S17) is performed. During the second exposure process (S17), wafer 130 (wafer W) on which second resist film 135 is formed is exposed. FIG. 10G shows the state of wafer 130 (wafer W) during the second exposure process (S17).

Wafer W is taken out from extension cooling apparatus 41 by wafer transport system 50 and is then transported to the exposure apparatus (not shown) through peripheral exposure apparatus 51. Further, the second exposure is performed on wafer W transported to the exposure apparatus.

When the second exposure is performed, as shown in FIG. 10G, the selected portion of second resist film 135 is exposed by using a second reticle R2 to generate soluble part 135a that is selectively dissolved by the developer made of, for example, an alkaline solvent, etc. By selectively generating soluble part 135a, a second pattern P2 including soluble part 135a that is dissolved by the developer and an insoluble part 135b that is not dissolved by the developer is obtained in second resist film 135.

Herein, for example, second pattern P2 is obtained by using second reticle R2 having patterns where lines are arranged. As shown in FIG. 10G, a critical dimension L20 and a space width SP20 of second pattern P2 may be, for example, 32 nm and 32 nm, respectively.

In addition, wafer W that is subjected to the second exposure is transported to extension apparatus 42 by wafer transport system 50 and is then maintained in main transport apparatus 13.

Next, the second heating process (S18) is performed. During the second heating process (S18), wafer W is heated. FIG. 10H shows the state of wafer 130 (wafer W) during the second heating process (S18).

Wafer W maintained in main transport apparatus 13 is transported to post exposure baking apparatus 44 or 45. Further, wafer W transported to post exposure baking apparatus 44 or 45 is subjected to the heating (post exposure baking). Wafer W that is subjected to the heating is transported to cooling apparatus 43 by main transport apparatus 13 and is subjected to the cooling.

The change into soluble part 135a of insoluble part 135b is promoted by performing the second heating process (S18). Therefore, as shown in FIG. 10H, the critical dimension L20 of second pattern P2 is slightly reduced to be L21 and the space width SP20 of second pattern P2 is slightly increased to be SP21.

Next, the second developing process (S19) is performed. During the second developing process (S19), second resist pattern P2 is formed by developing wafer 130 (wafer W) that is subjected to the second heating process (S18). FIG. 10I shows the state of wafer 130 (wafer W) during the second developing process (S19).

The second developing process (S19) corresponds to the developing method according to the exemplary embodiment of the present disclosure and the detailed processing method will be described.

Even during the second developing process (S19), soluble part 135a of second resist film 135 is dissolved and removed by using an alkaline solvent, such as, for example, TMAH, etc., such that only insoluble part 135b remains to form second resist pattern P2, as shown in FIG. 10I.

However, the surface of insoluble part 135b of second resist film 135 is dissolved by the developer by performing the second developing process (S19). For this reason, as shown in FIG. 10I, the critical dimension L21 of second resist pattern P2 is slightly reduced to be L22 and the space width SP21 of second resist pattern P2 is slightly increased to be SP22. Further, the surface of insoluble part 133b of first resist pattern P1 is also dissolved by the developer by performing the second developing process (S19). For this reason, as shown in FIG. 10I, the critical dimension L11 of first pattern P1 is slightly reduced to be L12 and the space width SP11 of first resist pattern P1 is slightly increased to be SP12.

Further, wafer W that is subjected to the second process (S16 to S19) is carried out from developing apparatus 18 by main transport apparatus 13. Wafer W carried-out by main transport apparatus 13 is transported to post baking apparatus 35 or 36 to perform the heating (post bake), is transported to extension apparatus 32, and then, is received in cassette C by wafer transport system 7.

Next, the second critical dimension measurement process (S20) is performed. During the second critical dimension measurement process (S20), critical dimensions CD1 (L12) of first resist pattern P1 remaining on wafer 130 (wafer W) and critical dimensions CD2 (L22) of the formed second resist pattern P2 are measured.

Wafer W received in cassette C is transported to critical dimension measurement apparatus 110 by wafer transport system 7. Further, the critical dimension L12 and space width SP12 of first resist pattern P1 and the critical dimension L22 and space width SP22 of second resist pattern P2 shown in FIG. 10I are measured.

In the exemplary embodiment of the present disclosure, critical dimension CD2 implies the critical dimension L22 for convenience. However, even though critical dimension CD2 implies space width SP22, positive and negative signs of dissolution speed SR21 and SR22 to be described below are only reverse and the exemplary embodiment of the present disclosure may be applied all the times.

In addition, even during the second critical dimension measurement process (S20), similar to the first critical measurement process (S15), it may be allowed to perform the measurement at a representative point such as a central point, etc., within the surface of wafer W and it may be allowed to perform the measurement at a plurality of measurement points within the surface of wafer W.

By performing up to the second critical dimension measurement process (S20), in wafer W subjected to the coating developing method including the developing method according to the exemplary embodiment of the present disclosure, etched film 131 may be etched by the etching apparatus that is mounted independently from the coating developing system 1, as shown in FIG. 10J.

Figure 11:
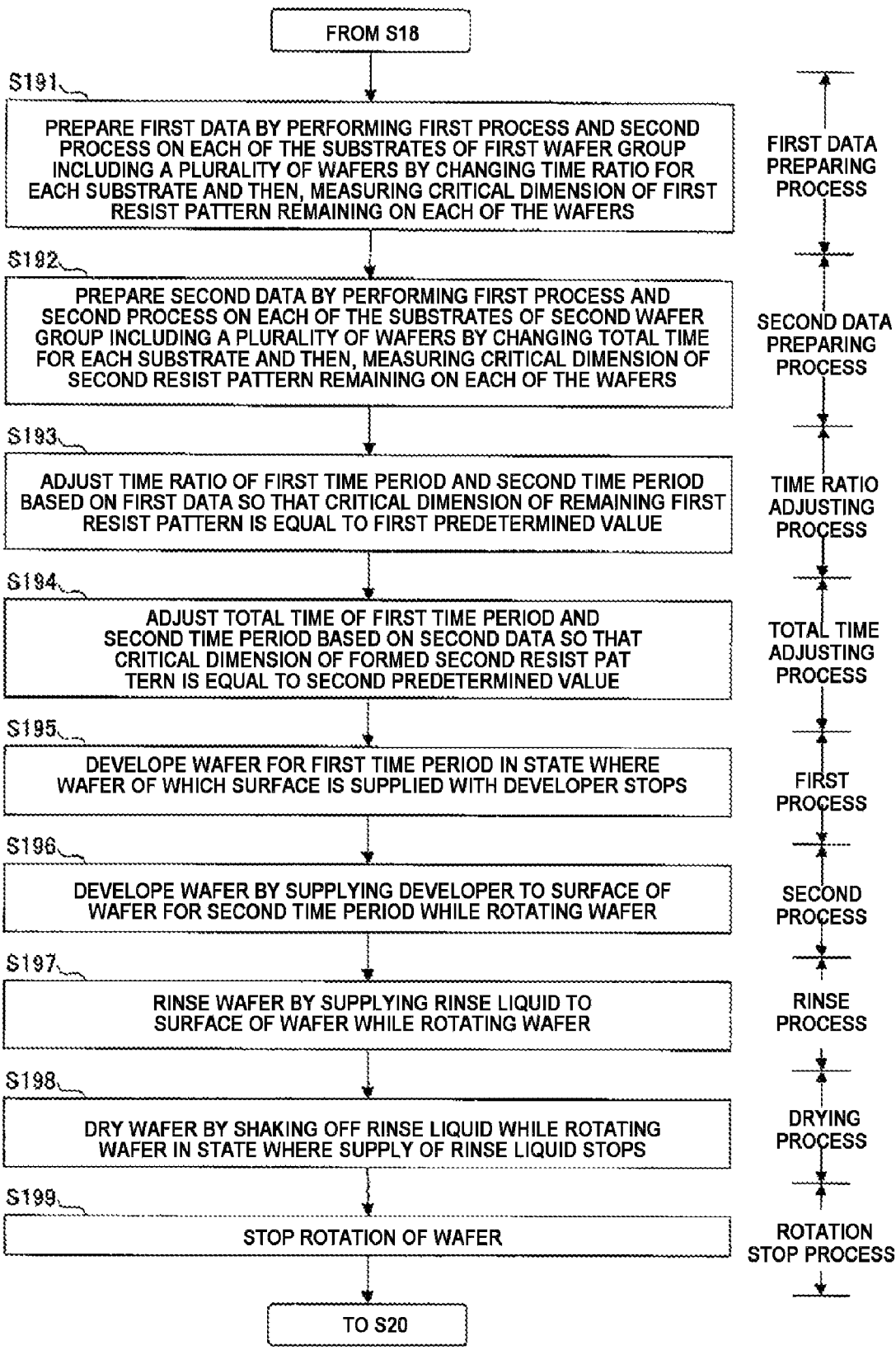
FIG. 11 is a flow chart for describing an order of each process of a second developing process that is a developing method according to the exemplary embodiment of the present disclosure.
Figure 12:
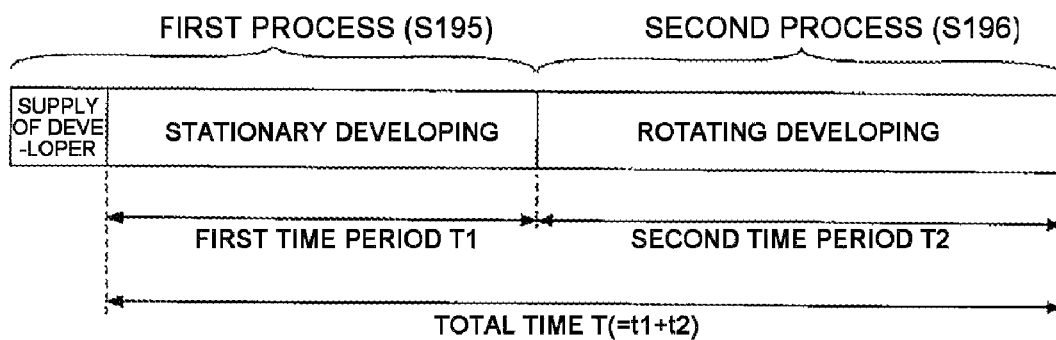
FIG. 12 is a timing chart for describing an order of the first process and the second process shown in the flow chart of FIG. 11.
Figure 13:
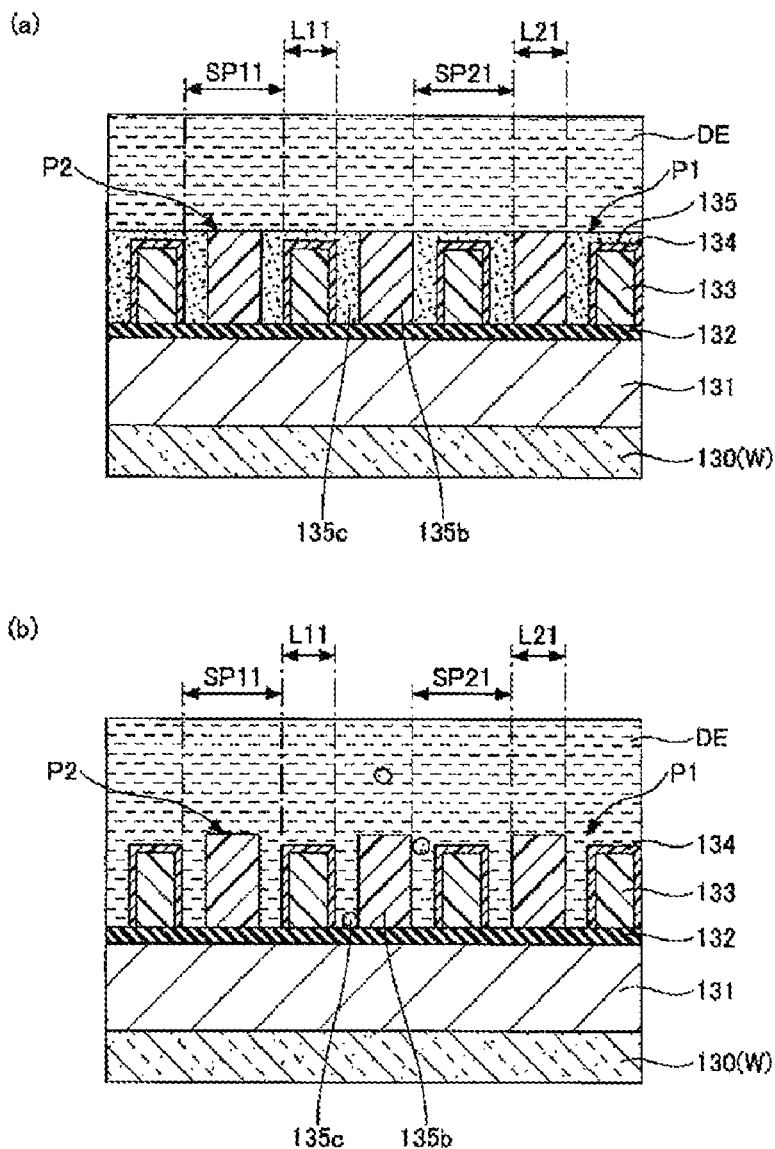
FIG. 13 is a cross-sectional view showing a state of a wafer at each process of the second developing process that is a developing method according to the exemplary embodiment of the present disclosure.

Next, the second developing process (S19) that is the developing method according to the exemplary embodiment of the present disclosure will be described with reference to FIGS. 11 and 13. FIG. 11 is a flow chart for describing an order of each process of the second developing process (S19). FIG. 12 is a timing chart for describing an order of a first process (S195) and a second process (S196). FIG. 13 is a cross-sectional view showing the state of wafer W during each process of the second developing process (S19).

As shown in FIG. 11, the second developing process (S19) according to the exemplary embodiment of the present disclosure includes a first data preparing process (S191), a second data preparing process (S192), a time ratio adjusting process (S193), a total time adjusting process (S194), first process (S195), second process (S196), a rinse process (S197), a drying process (S198), and a rotation stop process (S199).

Steps from the first data preparing process (S191) to the total time adjusting process (S194) may be previously performed before the second developing process (S19) starts.

First, the first data preparing process (S191) is performed. During the first data preparing process (S191), the first data showing the relationship between a time ratio RT of a first time period t1 and a second time period t2 to be described below and critical dimension CD1 of first resist pattern P1 is prepared.

Each wafer W of a first wafer group including a plurality of wafers W is provided with first resist pattern P1 by performing the above-mentioned first process (S11 to S14). Further, second resist pattern P2 is formed by performing the second process (S16 to S19). In this case, during the second developing process (S19) of the second process (S16 to S19), the first process (S195) and the second process (S196) are performed while changing time ratio RT of first time period t1 and second time period t2 to be described below for each wafer W. The second process (S16 to S19) is performed and the second critical dimension measurement process (S20) is then performed, such that critical dimension CD1 of first resist pattern P1 remaining on each wafer W is measured by using critical dimension measurement apparatus 110. Therefore, the first data showing the relationship between time ratio RT of first time period t1 and second time period t2 to be described below and critical dimension CD1 of first resist pattern P1 is prepared.

Next, the second data preparing process (S192) is performed. During the second data preparing process (S192), the second data showing the relationship between total time T of first time period t1 and second time period t2 to be described below, and critical dimension CD2 of second resist pattern P2 is prepared.

Each wafer W of a second wafer group including the plurality of wafers W is provided with first resist pattern P1 by performing the above-mentioned first processes (S11 to S14). Further, second resist pattern P2 is formed by performing the second processes (S16 to S19). In this case, during the second developing process (S19) of the second process (S16 to S19), the first process (S195) and the second process (S196) are performed while changing total time T of first time period t1 and second time period t2 to be described below for each wafer W. The second process (S16 to S19) is performed and the second critical dimension measurement process (S20) is then performed, such that critical dimension CD2 of second resist pattern P2 formed on each wafer W is measured by using critical dimension measurement apparatus 110. Therefore, the second data showing the relationship between total time T of first time period t1 and second time period t2 to be described below and critical dimension CD2 of second resist pattern P2 is prepared.

Alternatively, each wafer W of a single wafer group including the plurality of wafers W may be subjected to the first process (S195) and the second process (S196), under the plurality of conditions set in a two by two matrix type while independently changing two variables including time ratio RT and total time T for each wafer W. Therefore, the first data preparing process (S191) and the second data preparing process (S192) may be integrally performed.

Next, the time ratio adjusting process (S193) is performed. During the time ratio adjusting process (S193), time ratio RT of first time period t1 and second time period t2 is adjusted based on the first data so that critical dimension CD1 of the remaining first resist pattern P1 is equal to a first predetermined value CD1t. The detailed adjusting method will be described below.

Next, the total time adjusting process (S194) is performed. During the total time adjusting process (S194), total time T of first time period t1 and second time period t2 is adjusted based on the second data so that critical dimension CD2 of the formed second resist pattern P2 is equal to a second predetermined value CD2t. The detailed adjustment method will be described below.

Next, the first process (S195) is performed. During the first process (S195), developer DE is supported to the surface of wafer W and wafer W of which the surface is supplied with developer DE stops, thereby developing (stationary developing) wafer W for first time period t1 in the state where the supply of developer DE stops, as shown in FIG. 12. FIG. 13A shows the state of wafer 130 (wafer W) during the first process (S195).

During the first process (S195), the first developer supplying nozzle 70 waiting within waiting cleaning part 88 present at the waiting position T moves to a start position S (shown in FIG. 5) that is within cup 65 and is the outside of an end of wafer W. Further, first developer supplying nozzle 70 performs the supply of developer DE while moving from the start position S of the outside of an end of wafer W to an end position E of the outside of the other end at a speed of 30 to 100 mm/sec while discharging the developer. In this case, developer DE is supplied to the entire surface of wafer W and the liquid film of developer DE of the predetermined thickness, for example, about 1 mm is supplied, as shown in FIG. 13A. When the diameter of wafer W is about 300 mm, the time consumed to supply developer DE by first developer supplying nozzle 70 is 3 to 10 seconds. Further, the movement to the end position E of first developer supplying nozzle 70 ends, such that the supply of developer DE stops and the developing of wafer W starts, thereby developing wafer W of which the surface is supplied with developer DE for the predetermined first time period t1, for example, 15 seconds in the state where wafer W stops.

Herein, the movement to the end position E of first developer supplying nozzle 70 ends for convenience, such that the time consumed from stopping the supply of developer DE and to ending the first process (S195) is set to first time period t1.

However, the first data is prepared and the reference of the period of first time period t1 may be constant in order to adjust time based on the first data. Therefore, the time consumed to end the first process (S195) after first developer supplying nozzle 70 starts to move from the start position S in the state where developer DE is discharged may be set to first time period t1.

Next, the second process (S196) is performed. During the second process (S196), wafer W is developed (rotating developing) by supplying developer DE to the surface of wafer W for the second time period t2 while rotating wafer W. FIG. 13B shows the state of wafer 130 (wafer W) during the second process (S196).

During the second process (S196), second developer supplying nozzle 71 moves above the central portion of wafer W. Further, the rotation of wafer W starts at the predetermined speed and developer DE is supplied to wafer W from second developer supplying nozzle 71, thereby developing wafer W. In this case, developer DE is supplied by the predetermined flux that is set in the developing program of the apparatus controller (not shown), for example, 500 ml/min from the second developer supplying nozzle 71. Alternatively, wafer W is controlled and rotated to a predetermined revolution VR, for example, 1000 rpm by rotation control apparatus 62, for the predetermined second time period t2 set in the developing program of the apparatus controller (not shown), for example, 8 seconds.

Next, the rinse process (S197) is performed. During the rinse process (S197), wafer W is subjected to the rinsing by supplying a rinse liquid to the surface of wafer W while rotating wafer W.

During the rinse process (S197), cleaning nozzle 72 moves above the central portion of wafer W. Further, wafer W starts to rotate at the predetermined speed and the cleaning liquid is supplied to wafer W from the cleaning nozzle 72, thereby cleaning wafer W. In this case, cup 65 and out cup 66 rise, such that cup 65 and cup 66 receive the cleaning liquid, etc., scattered from wafer W.

Next, the drying process (S198) is performed. During the drying process (S198), wafer W is dried by shaking off the rinse liquid while rotating wafer W in the state where the supply of the rinse liquid stops. Further, the rotation of wafer W stops by performing the rotation stop process (S199) and the second developing process (S19) ends.

Hereinafter, the method of adjusting time ratio RT during the time ratio adjusting process (S193) and the method of adjusting total time T during the total time adjusting process (S194) will be described with reference to FIGS. 13 to 16.

Figure 14:
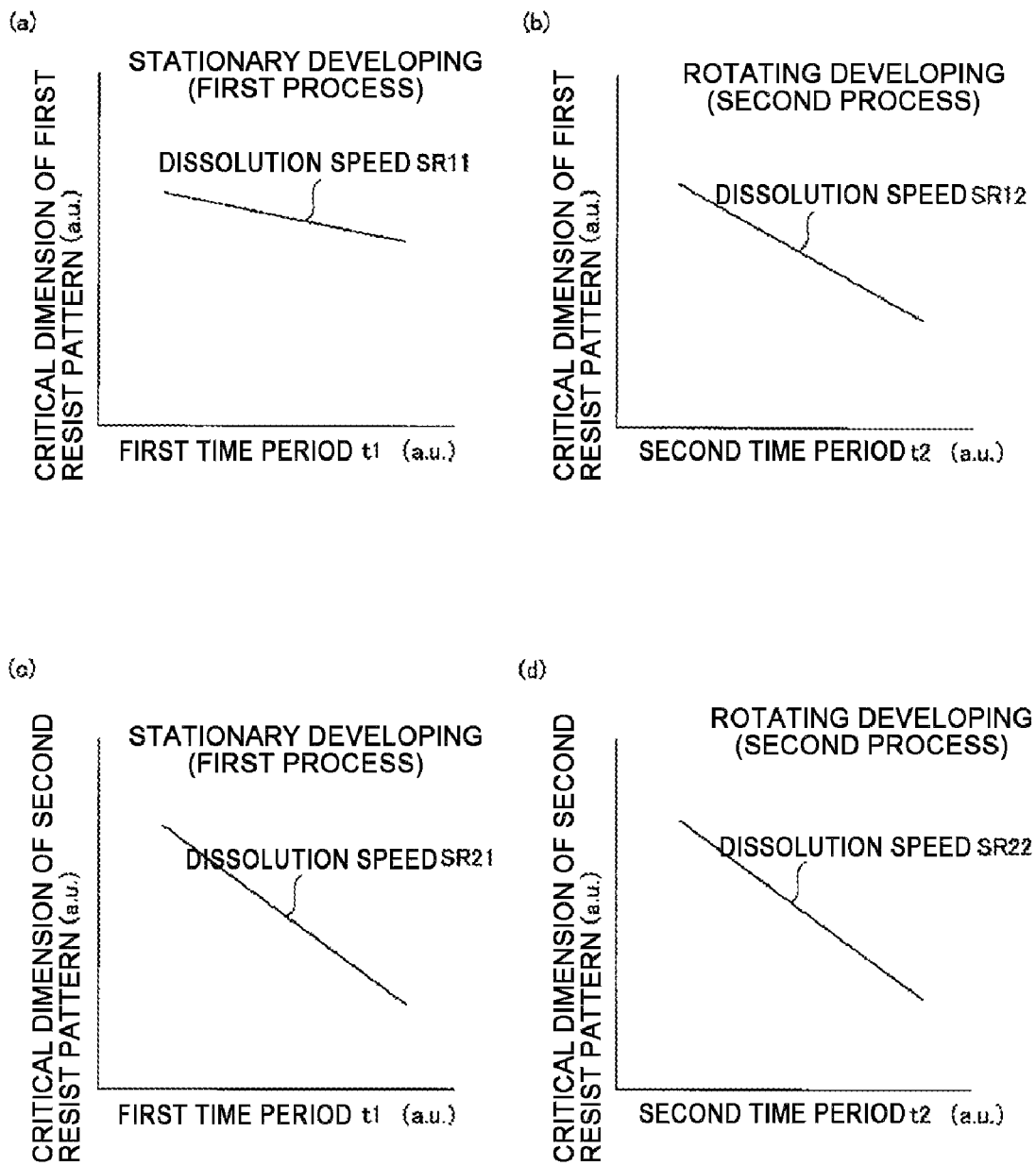
FIG. 14 is a graph showing the relationship between any one of a critical dimension CD1 of a first resist pattern P1 and a critical dimension CD2 of a second resist pattern P2, and any one of a first time period t1 and a second time period t2.

FIG. 14 is a graph showing a relationship between any one of critical dimension CD1 of first resist pattern P1 and critical dimension CD2 of second resist pattern P2 and any one of first time period t1 and second time period t2. FIG. 14A shows the relationship between critical dimension CD1 and first time period t1. FIG. 14B shows the relationship between critical dimension CD1 and second time period t2. FIG. 14C shows the relationship between critical dimension CD2 and first time period t1. FIG. 14D shows the relationship between critical dimension CD2 and second time period t2. FIG. 15 is a graph showing the change in critical dimension CD1 of first resist pattern P1 and critical dimension CD2 of second resist pattern P2 when the stationary developing is performed for first time period t1 and the rotating developing is performed for second time period t2. FIGS. 15A and 15B each show critical dimension CD1 and critical dimension CD2. FIG. 16 is a graph for describing the method of controlling first time period t1 and second time period t2 so that critical dimension CD1 of first resist pattern P1 is equal to first predetermined value CD1*t* and critical dimension CD2 of second resist pattern P2 is equal to second predetermined value CD2*t*. FIGS. 16A and 16B each show critical dimension CD1 and critical dimension CD2.

The critical dimension of first resist pattern P1 formed on wafer W by performing the first process (S11 to S14) just before the first process (S195) of the second developing process (S19) is performed, is L11. Further, the critical dimension of second resist pattern P2 formed as remaining insoluble part 135*b* by performing up to the second heating process (S18) of the second process (S16 to S19) just before the first process (S195) of the second developing process (S19) is performed, is L21.

As described above, during the first process (S195) and the second process (S196), soluble part 135*a* of second resist film 135 is dissolved and removed by using developer DE that is the alkaline solvent such as TMAH, etc. Therefore, only insoluble part 135*b* of second resist film 135 remains such that second resist pattern P2 is formed.

In this case, the change into soluble part 135 of insoluble part 135*b* is progressed with the passage of time at the surface contacting developer DE of insoluble part 135*b* of second resist film 135 and a portion changed into soluble part 135*a* is more dissolved. For this reason, critical dimension CD2 of second resist pattern P2 is reduced with the passage of time.

As shown in FIG. 14C, during the first process (S195), the dissolution speed (the speed where critical dimension CD2 of second resist pattern P2 is reduced) of second resist film 135 is SR21 that is a finite value. Further, as shown in FIG. 14D, during the second process (S196), the dissolution speed (the speed where critical dimension CD2 of second resist pattern P2 is reduced) of second resist film 135 is SR22 that is a finite value. SR21 and SR22 imply the size of the absolute value of the dissolution speed.

Further, regarding second resist film 135, the change (solubilization) into soluble part 135*a* of insoluble part 135*b* at the exposed portion is not completed. For this reason, the reactivity of solubilization is high regardless of whether the second resist pattern contacts the fresh developer DE. Therefore, the dissolution speeds are approximately the same regardless of the difference in the developing method between the stationary developing (first process) and the rotating developing (second process), such that SR21=SR22 is established.

Meanwhile, even in the portion contacting developer DE of first resist pattern P1 that is formed as insoluble part 133*b* and is already formed on wafer W, the change into soluble part 133*a* of insoluble part 133*b* is slightly progressed over time and the portion changed into soluble part 133*a* is more dissolved. For this reason, critical dimension CD1 of first resist pattern P1 is reduced with the passage of time.

As shown in FIG. 14A, during the first process (S195), the dissolution speed (the speed where critical dimension CD1 of first resist pattern P1 is reduced) of insoluble part 133*b* is SR11 that is a finite value. Further, as shown in FIG. 14B, during the second process (S196), the dissolution speed (the speed where critical dimension CD1 of first resist pattern P1 is reduced) of insoluble part 133*b* is SR12 that is a finite value. Since first resist pattern P1 is slightly dissolved even when the surface of first resist pattern P1 is subjected to the curing, critical dimension CD1 of first resist pattern P1 is reduced according to dissolution. Further, SR11 and SR12 imply the size of the absolute value of the dissolution speed.

However, regarding first resist pattern P1, when the first developing process (S14) is performed, the change (solubilization) into soluble part 133*a* of insoluble part 133*b* is approximately completed. For this reason, the reactivity of the solubilization is low when first resist pattern P1 does not contact the fresh developer DE. Therefore, in the stationary developing (first process) hard to contact the fresh developer DE and the rotating developing (second process) easy to contact the fresh developer DE, the dissolution speed is largely different.

During the first process (S195) that is the stationary developing, as shown in FIG. 13A, in first resist pattern P1, first resist film 133 or second resist film 135 is covered with a dissolved material 135*c* dissolved by developer DE. For this reason, since first resist pattern P1 may not contact the fresh developer DE, dissolution speed SR11 thereof is relatively reduced. Meanwhile, during the second process (S196) that is the rotating developing, the dissolved materials 135*c* of the second resist film 135 are sequentially washed, as shown in FIG. 13B. For this reason, since first resist pattern P1 may contact the fresh developer DE at all times, dissolution speed SR12 thereof is relatively increased. Therefore, SR11<SR12 is established. FIGS. 14A to 14D show, by way of example, the case where SR11<SR12<SR21=SR22 is established.

There may be the case where first resist pattern P1 does not contact developer DE because it is covered with second resist film 135, such that SR11 may be negligibly small as compared with SR12, SR21, and SR22. In this case, SR11=0 may be established.

When the relationship of SR11<SR12<SR21=SR22 is satisfied, the stationary developing (first process) is performed for first time period t1 and the rotating developing (second process) is performed for second time period t2, and the change in critical dimension CD1 and critical dimension CD2 are each shown in FIGS. 15A and 15B.

As shown in FIG. 15B, regarding second resist pattern P2, critical dimension CD2 does not depend on time ratio RT (=t1/T) of first time period t1 and second time period t2 but depends on total time T of first time period t1 and second time period t2. Therefore, critical dimension CD2 may be freely changed by adjusting total time T of first time period t1 and second time period t2.

Meanwhile, as shown in FIG. 15A, regarding first resist pattern P1, dissolution speed SR11 during the stationary developing (first process) is slower than dissolution speed SR12 during the rotating developing (second process). Therefore, critical dimension CD1 may be freely changed by adjusting time ratio RT (=t1/T) of first time period t1 and second time period t2.

FIG. 16 shows an example where time ratio RT is adjusted so that critical dimension CD1 is equal to first predetermined value CD1*t* and total time T is adjusted so that critical dimension CD2 is equal to second predetermined value CD2*t*. As shown in FIG. 16B, critical dimension CD2 may be equal to second predetermined value CD2*t* by adjusting total time T to predetermined value T1. Further, as shown in FIG. 16A, total time T is adjusted to a predetermined value T1 and then, time ratio RT is adjusted to RT1 (=t1/T1), such that critical dimension CD1 may be equal to first predetermined value CD1*t*.

Further, first predetermined value CD1*t* and second predetermined value CD2*t* are set to be equal to each other, such that critical dimension CD1 and critical dimension CD2 may be equal to each other.

FIG. 16B shows that critical dimension CD2 is L21 at total time T=0, that is, before the second developing process (S19) is performed. Further, FIG. 16A shows the case where in an example of SR11=0, critical dimension CD1 remains unchanged as L11, when time ratio RT is 1, that is, only the stationary developing (first process) is performed and the rotating developing (second process) is not performed.

As described above, according to the exemplary embodiment of the present disclosure, when the second developing is performed in the double patterning by the LLE, the stationary developing (first process) is performed for first time period t1 and then, the rotating developing (second process) is performed for second time period t2. During the stationary developing (first process) and the rotating developing (second process), dissolution speed SR21 and SR22 of the second resist pattern are approximately the same as each other. However, dissolution speed SR11 of first resist pattern P1 during the stationary developing (first process) is slower than that dissolution speed SR12 of first resist pattern P1 during the rotating developing (second process). Therefore, critical dimension CD1 of first resist pattern P1 and critical dimension CD2 of second resist pattern P2 may be independently controlled by adjusting total time T of first time period t1 and second time period t2 and time ratio RT of first time period t1 and second time period t2.

Further, critical dimension CD1 and critical dimension CD2 may be controlled to be equal to each other. For this reason, in the double patterning, when the fine resist pattern including first resist pattern P1 and second resist pattern P2 is formed, the shape thereof may be controlled precisely.

In addition, both critical dimension CD1 and critical dimension CD2 may be controlled by adjusting the processing conditions of the second developing process (S19). For this reason, there is no need to adjust again the processing conditions of the first process (S11 to S14). For this reason, critical dimension CD1 and critical dimension CD2 may be easily controlled.

The exemplary embodiment of the present disclosure described an example of developing wafer W for first time period t1 in the state where the supply of the developer stops by supplying the developer to the surface of wafer W and stopping wafer W of which the surface is supplied with the developer, during the first process (S195). However, the first process (S195) is enough to make it difficult to contact the remaining first resist pattern P1 to the fresh developer as compared with the second process (S196) and is not limited to the example of stopping the supply of the developer. Therefore, during the first process (S195), it may be allowed to develop wafer W for first time period t1 in the state where the developer is supplied to the surface of wafer W, wafer W of which the surface is supplied with the developer stops, and the supply of the developer does not completely stop.

Further, the exemplary embodiment of the present disclosure described an example of performing the stationary developing during the first process (S195), that is, an example of developing wafer W for first time period t1 in the state where the developer is supplied to the surface of wafer W and wafer W of which the surface is supplied with the developer stops. However, the first process (S195) is enough to make it difficult to contact the remaining first resist pattern P1 to the fresh developer as compared with the second process (S196) and is not limited to the stationary developing. Therefore, for example, during the first process (S195), wafer W may be subjected to the developing by supplying the developer to the surface of wafer W for first time period t1 while rotating wafer W at a relatively low first revolution. Further, during the second process (S196), wafer W may be subjected to the developing by supplying the developer to the surface of wafer W for second time period t2 while rotating wafer W at a second revolution higher than the first revolution.

Modified Example of Exemplary Embodiment

Hereinafter, the developing method according to the modified example of the exemplary embodiment of the present disclosure and the coating developing method including the developing method will be described with reference to FIGS. 17 and 18.

The present modified example is different from the exemplary embodiment of the present disclosure, in that time ratio RT and total time T are adjusted based on the measurement value of critical dimension CD1 of first resist pattern P1 measured during the first critical dimension measurement process (S15) after the first process (S11 to S14) is performed.

Even in the present modified example, coating developing system 1 described with reference to FIGS. 1 to 3 may be used. Further, even in the present modified example, developing apparatus 18 described with reference to FIGS. 4 to 7 may be used. Further, even in the modified example, critical dimension measurement apparatus 110 described with reference to FIG. 8 may be used.

In addition, even the coating developing method including the developing method according to the present modified example may be the same as the coating developing method described with reference to FIGS. 9 and 10.

Next, the second developing process (S19) that is the developing method according to the present modified example will be described with reference to FIG. 17. Further, the method of adjusting time ratio RT during the time ratio adjusting process (S193) and the method of adjusting total time T during the total time adjusting process (S194) will be described with reference to FIG. 18. FIG. 17 is a flow chart for describing an order of each process of the second developing process (S19). FIG. 18 is a graph for describing the method of adjusting first time period t1 and second time period t2 so that critical dimension CD1 of first resist pattern P1 is equal to first predetermined value CD1$t$ and critical dimension CD2 of second resist pattern P2 is equal to second predetermined value CD2$t$. FIGS. 18A and 18B each show critical dimension CD1 and critical dimension CD2.

Figure 17:
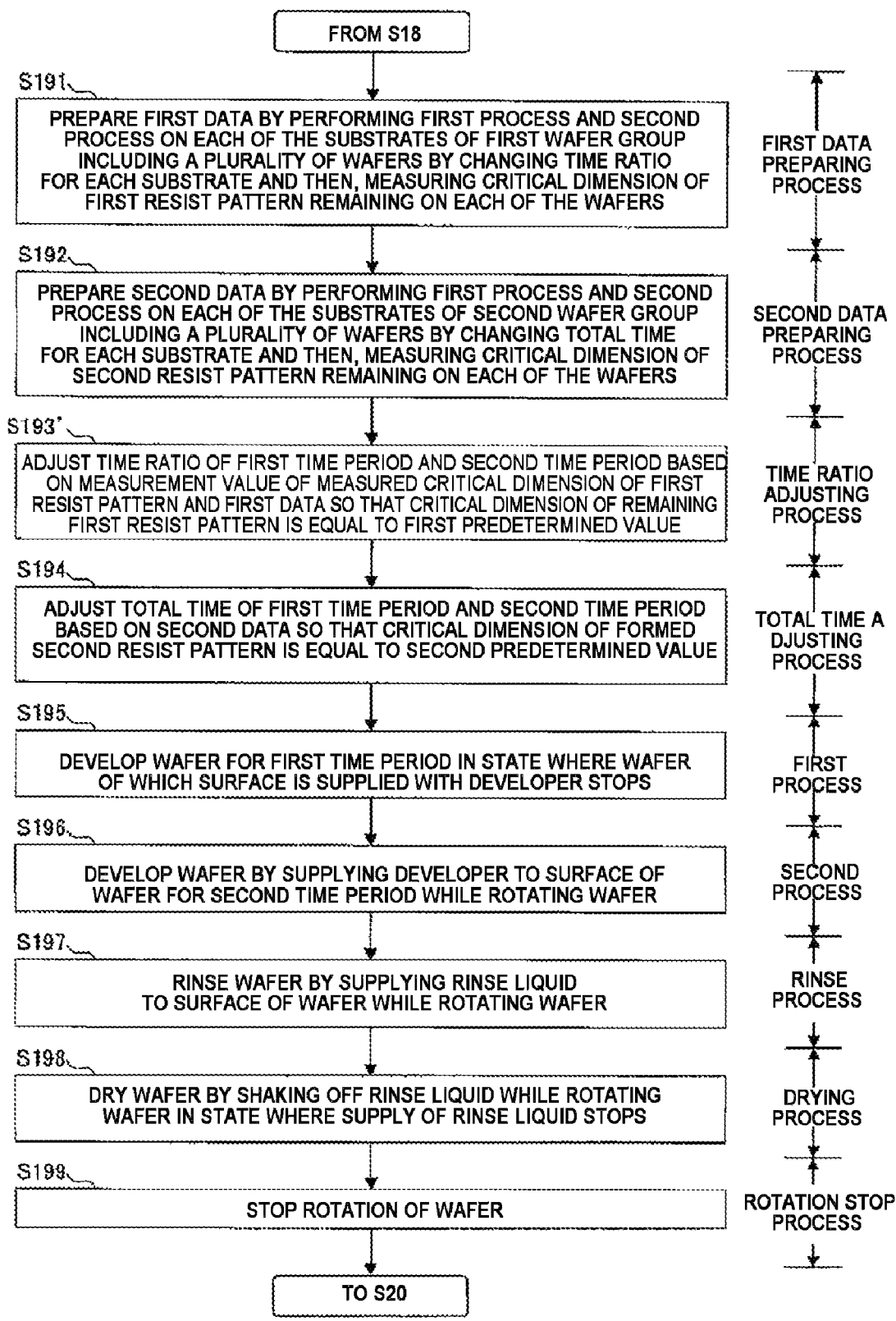
FIG. 17 is a flow chart for describing an order of each process of a second developing process that is a developing method according to a modified example of the exemplary embodiment of the present disclosure.

As shown in FIG. 17, the second developing process (S19) according to the present modified example includes first data preparing process (S191), second data preparing process (S192), a time ratio adjusting process (S193'), total time adjusting process (S194), first process (S195), second process (S196), rinse process (S197), drying process (S198), and rotation stop process (S199). Among others, each process other than the time ratio adjusting process (S193') may be the same as each process described with reference to FIG. 11 in the exemplary embodiment of the present disclosure.

Meanwhile, in the present modified example, during the time ratio adjusting process (S193'), time ratio RT of first time period t1 and second time period t2 is adjusted based on the measurement value L11$m$ of the critical dimension of first resist pattern P1 measured during the first critical dimension measurement process (S15) and the first data so that critical dimension CD1 of the remaining first resist pattern P1 is equal to first predetermined value CD1$t$.

The measurement value L11$m$ is obtained by performing the first critical dimension measurement process (S15) after the first process (S11 to S14) to measure critical dimension CD1 of first resist pattern P1 formed on wafer W.

Even in the present modified example, similar to the description of FIG. 15B, critical dimension CD2 may be freely changed by adjusting total time T of first time period t1 and second time period t2. Further, similar to the description of FIG. 15A, critical dimension CD1 may be freely changed by adjusting time ratio RT (=t1/T1) of first time period t1 and second time period t2.

Therefore, regarding critical dimension CD2, similar to the exemplary embodiment of the present disclosure, even in the modified example, critical dimension CD2 may be equal to second predetermined value CD2t by adjusting total time T to predetermined value T1, as shown in FIG. 18B.

Meanwhile, regarding critical dimension CD1, in the case where performing the continuous processing on each wafer W of the wafer group including a plurality of wafers W, there may be the case where the critical dimension L11 of first resist pattern P1 just before the first process (S195) at any wafer W is different from the critical dimension L11 at the first wafer W as time passes differently. As a result, as shown in FIG. 18A, a straight line showing the relationship between time ratio RT (=t1/T) and critical dimension CD1 of first resist pattern P1 remaining after the second developing process (S19) is out of a straight line B1 represented by a dotted line, such that it becomes a straight line B2 represented by a solid line.

In this case, time ratio RT to make critical dimension CD1 to be equal to first predetermined value CD1t is corrected from the RT1 obtained based on the straight line B1 to RT1' obtained based on the straight line B2. Therefore, even when critical dimension CD1 of first resist pattern P1 formed during the first processes (S11 to S14) is out of L11, critical dimension CD1 of first resist pattern P1 remaining after the second developing process (S19) may be equal to first predetermined value CD1t.

Even in the modified example, during the first process (S195), it may be allowed to develop wafer W for first time period t1 in the state where the developer is supplied to the surface of wafer W, wafer W of which the surface is supplied with the developer stops, and the supply of the developer does not completely stop.

In addition, even in the present modified example, during the first process (S195), wafer W may be subjected to the developing by supplying the developer to the surface of wafer W for first time period t1 while rotating wafer W at the relatively low first revolution. Further, during the second process (S196), wafer W may be subjected to the developing by supplying the developer to the surface of wafer W for second time period t2 while rotating wafer W at the second revolution higher than the first revolution.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A developing method comprising:
   forming a first resist pattern on a surface of a substrate;
   forming a resist film on the surface of the substrate to coat the first resist pattern;
   exposing the substrate formed with the resist film; and
   developing the substrate exposed at the exposing step to form a second resist pattern with the resist film while the first resist pattern remains,
   wherein the developing further comprising:
      a first process that supplies a developer to the surface of the substrate and develops the substrate for a first time period in a state where the substrate of which the surface is supplied with the developer stops; and
      a second process that develops the substrate by supplying the developer to the surface of the substrate for a second time period while rotating the substrate, after the first process,
      wherein a time ratio of the first time period to the second time period is adjusted so that a critical dimension of the remaining first resist pattern is equal to a first predetermined value, and a total time of the first time period and the second time period is adjusted so that a critical dimension of the formed second resist pattern is equal to a second predetermined value.

2. A developing method comprising:
   forming a first resist pattern on a substrate;
   forming a resist layer on the substrate to cover the first resist pattern;
   exposing the substrate formed with the resist layer; and
   developing the substrate exposed at the exposing step to form a second resist pattern with the resist layer while the first resist pattern remains,
   wherein the developing further comprising:
      a first process that develops the substrate by supplying a developer to the surface of the substrate for a first time period while rotating the substrate at a first revolutions; and
      a second process that develops the substrate by supplying the developer to the surface of the substrate for a second time period while rotating the substrate at a second revolution higher than the first revolutions, after the first process,
      wherein a time ratio of the first time period to the second time period is adjusted so that a critical dimension of the remaining first resist pattern is equal to a first predetermined value, and a total time of the first time period and the second time period is adjusted so that a critical dimension of the formed second resist pattern is equal to a second predetermined value.

3. The developing method of claim 2, wherein the second predetermined value is equal to the first predetermined value.

4. The developing method of claim 3, wherein the time ratio is adjusted based on a first data showing a relationship between the time ratio and the critical dimension of the first resist pattern, and
   the total time is adjusted based on a second data showing a relationship between the total time and the critical dimension of the second resist pattern.

5. The developing method of claim 4, further comprising:
   preparing the first data by performing the first process and the second process on each of the substrates of a first substrate group including a plurality of substrates by changing the time ratio for each substrate, and then, measuring the critical dimension of the first resist pattern remaining on each of the substrates; and
   preparing the second data by performing the first process and the second process on each of the substrates of a second substrate group including a plurality of substrates by changing the total time for each substrate, and then, measuring the critical dimension of the second resist pattern formed on each of the substrates.

6. The developing method of claim 5, further comprising measuring the critical dimension of the formed first resist pattern prior to forming the resist film after forming the first resist pattern,
   wherein the time ratio is adjusted based on the measurement value of the measured critical dimension of the first resist pattern and the first data.

7. The developing method of claim 4, further comprising measuring the critical dimension of the formed first resist pattern prior to forming the resist film after forming the first resist pattern, wherein the time ratio is adjusted based on the measurement value of the measured critical dimension of the first resist pattern and the first data.

8. The developing method of claim 2, wherein the time ratio is adjusted based on a first data showing a relationship between the time ratio and the critical dimension of the first resist pattern, and the total time is adjusted based on a second data showing a relationship between the total time and the critical dimension of the second resist pattern.

9. The developing method of claim 8, further comprising:

preparing the first data by performing the first process and the second process on each of the substrates of a first substrate group including a plurality of substrates by changing the time ratio for each substrate, and then, measuring the critical dimension of the first resist pattern remaining on each of the substrates; and preparing the second data by performing the first process and the second process on each of the substrates of a second substrate group including a plurality of substrates by changing the total time for each substrate, and then, measuring the critical dimension of the second resist pattern formed on each of the substrates.

10. The developing method of claim 9, further comprising measuring the critical dimension of the formed first resist pattern prior to forming the resist film after forming the first resist pattern, wherein the time ratio is adjusted based on the measurement value of the measured critical dimension of the first resist pattern and the first data.

11. The developing method of claim 8, further comprising measuring the critical dimension of the formed first resist pattern prior to forming the resist film after forming the first resist pattern, wherein the time ratio is adjusted based on the measurement value of the measured critical dimension of the first resist pattern and the first data.

12. The developing method of claim 1, wherein the second predetermined value is equal to the first predetermined value.

13. The developing method of claim 12, wherein the time ratio is adjusted based on a first data showing a relationship between the time ratio and the critical dimension of the first resist pattern, and the total time is adjusted based on a second data showing a relationship between the total time and the critical dimension of the second resist pattern.

14. The developing method of claim 13, further comprising:

preparing the first data by performing the first process and the second process on each of the substrates of a first substrate group including a plurality of substrates by changing the time ratio for each substrate, and then, measuring the critical dimension of the first resist pattern remaining on each of the substrates; and preparing the second data by performing the first process and the second process on each of the substrates of a second substrate group including a plurality of substrates by changing the total time for each substrate, and then, measuring the critical dimension of the second resist pattern formed on each of the substrates.

15. The developing method of claim 14, further comprising measuring the critical dimension of the formed first resist pattern prior to forming the resist film after forming the first resist pattern, wherein the time ratio is adjusted based on the measurement value of the measured critical dimension of the first resist pattern and the first data.

16. The developing method of claim 13, further comprising measuring the critical dimension of the formed first resist pattern prior to forming the resist film after forming the first resist pattern, wherein the time ratio is adjusted based on the measurement value of the measured critical dimension of the first resist pattern and the first data.

17. The developing method of claim 1, wherein the time ratio is adjusted based on a first data showing a relationship between the time ratio and the critical dimension of the first resist pattern, and the total time is adjusted based on a second data showing a relationship between the total time and the critical dimension of the second resist pattern.

18. The developing method of claim 17, further comprising:

preparing the first data by performing the first process and the second process on each of the substrates of a first substrate group including a plurality of substrates by changing the time ratio for each substrate, and then, measuring the critical dimension of the first resist pattern remaining on each of the substrates; and preparing the second data by performing the first process and the second process on each of the substrates of a second substrate group including a plurality of substrates by changing the total time for each substrate, and then, measuring the critical dimension of the second resist pattern formed on each of the substrates.

19. The developing method of claim 18, further comprising measuring the critical dimension of the formed first resist pattern prior to forming the resist film after forming the first resist pattern, wherein the time ratio is adjusted based on the measurement value of the measured critical dimension of the first resist pattern and the first data.

20. The developing method of claim 17, further comprising measuring the critical dimension of the formed first resist pattern prior to forming the resist film after forming the first resist pattern, wherein the time ratio is adjusted based on the measurement value of the measured critical dimension of the first resist pattern and the first data.

\* \* \* \* \*